(12) United States Patent
Lee et al.

(10) Patent No.: US 12,414,321 B2
(45) Date of Patent: Sep. 9, 2025

(54) CONTACT PROFILE OPTIMIZATION FOR IC DEVICE PERFORMANCE IMPROVEMENT

(71) Applicant: Taiwan Semiconductor Manufacturing Company, Ltd., Hsin-Chu (TW)

(72) Inventors: Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 567 days.

(21) Appl. No.: 17/738,265

(22) Filed: May 6, 2022

(65) Prior Publication Data
US 2023/0034482 A1 Feb. 2, 2023

Related U.S. Application Data

(60) Provisional application No. 63/227,424, filed on Jul. 30, 2021.

(51) Int. Cl.
*H10D 84/01* (2025.01)
*H10B 10/00* (2023.01)
*H10D 30/62* (2025.01)
*H10D 30/67* (2025.01)
*H10D 62/13* (2025.01)
(Continued)

(52) U.S. Cl.
CPC ......... *H10D 30/6219* (2025.01); *H10B 10/12* (2023.02); *H10B 10/125* (2023.02); *H10D 30/6729* (2025.01); *H10D 30/6735* (2025.01); *H10D 62/151* (2025.01); *H10D 64/01* (2025.01); *H10D 64/015* (2025.01); *H10D 64/017* (2025.01); *H10D 64/018* (2025.01); *H10D 64/021* (2025.01); *H10D 64/258* (2025.01); *H10D 84/013* (2025.01); *H10D 84/0147* (2025.01); *H10D 84/0149* (2025.01); *H10D 84/0158* (2025.01);
(Continued)

(58) Field of Classification Search
CPC ....... H01L 29/41791; H01L 21/823431; H01L 21/823468; H01L 21/823475; H01L 27/088; H01L 29/0847; H01L 29/401
USPC ........................................................ 257/288
See application file for complete search history.

(56) References Cited

U.S. PATENT DOCUMENTS 7,667,271 B2 2/2010 Yu et al.
7,910,453 B2 3/2011 Xu et al.
(Continued)

FOREIGN PATENT DOCUMENTS

CN 112530861 A * 3/2021 ........ H01L 21/28114
TW 201926717 A 7/2019

*Primary Examiner* — Phuc T Dang
(74) *Attorney, Agent, or Firm* — HAYNES AND BOONE, LLP

(57) ABSTRACT

A semiconductor device includes an active region that extends in a first horizontal direction. A source/drain component is disposed over the active region. A source/drain contact is disposed over the source/drain component. A gate structure is disposed over the active region. The gate structure extends in a second horizontal direction different from the first horizontal direction. Side surfaces of the source/drain contact are substantially more tapered in the second horizontal direction than in the first horizontal direction.

20 Claims, 19 Drawing Sheets

(51) Int. Cl.
  *H10D 64/01* (2025.01)
  *H10D 64/23* (2025.01)
  *H10D 84/03* (2025.01)
  *H10D 84/83* (2025.01)

(52) U.S. Cl.
  CPC .......... *H10D 84/038* (2025.01); *H10D 84/83* (2025.01); *H10D 84/834* (2025.01)

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2012/0068273 A1 | 3/2012 | Fischer et al. |
| 2014/0001574 A1 | 1/2014 | Chen et al. |
| 2014/0110755 A1 | 4/2014 | Colinge |
| 2014/0151812 A1 | 6/2014 | Liaw |
| 2020/0083350 A1 | 3/2020 | Bao et al. |
| 2021/0098592 A1* | 4/2021 | Kang ................ H01L 29/66545 |
| 2022/0165857 A1* | 5/2022 | Park ..................... H01L 29/775 |

\* cited by examiner

CONTACT PROFILE OPTIMIZATION FOR IC DEVICE PERFORMANCE IMPROVEMENT

PRIORITY DATA

The present application is a utility U.S. Patent Application of provisional U.S. Patent Application No. 63/227,424, filed on Jul. 30, 2021, entitled "Contact Profile Optimization for Time Delay Improvement", the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the sizes of the transistor components continue to get smaller, the parasitic resistance and/or parasitic capacitance of certain transistor components may increase, or at least become a greater factor in determining the time delay of the transistor. These problems may adversely impact the performance and/or yield of ICs.

Therefore, although existing semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1B:
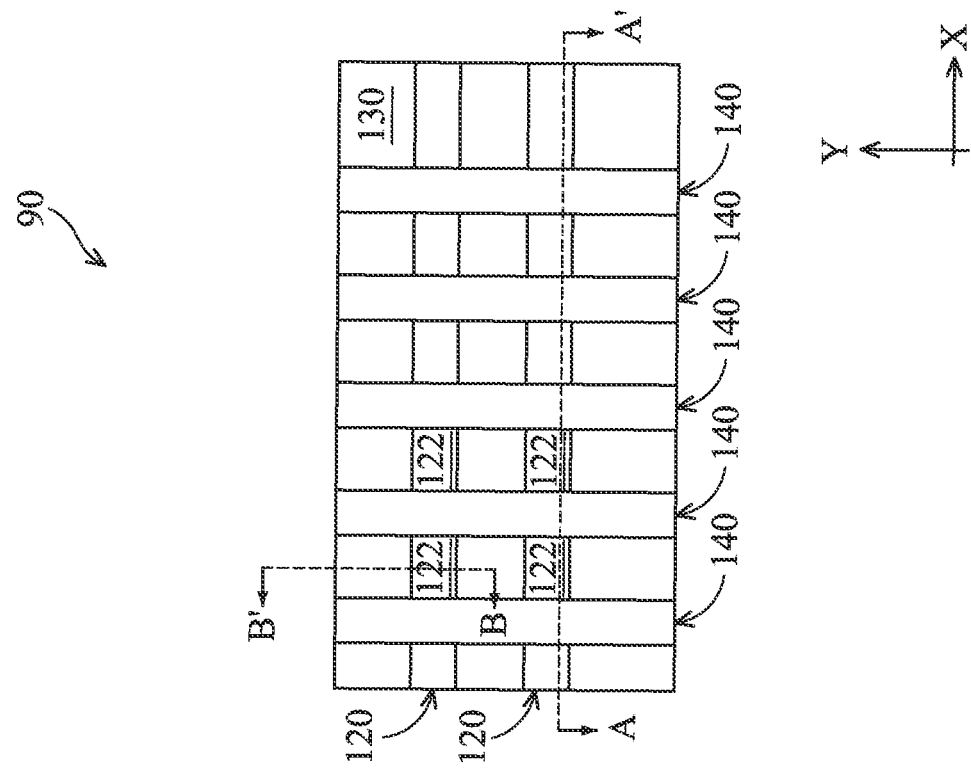
FIG. 1B illustrates a top view of a FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, which may be fabricated using field-effect transistors (FETs) such as three-dimensional fin-line FETs (FinFETs) or multi-channel gate-all-around (GAA) devices. FinFET devices have semiconductor fin structures that protrude vertically out of a substrate. The fin structures are active regions, from which source/drain regions and/or channel regions are formed. The gate structures partially wrap around the fin structures. GAA devices have multiple elongated nano-structure channels that may be implemented as nano-tubes, nano-sheets, or nanowires. In recent years, FinFET devices and GAA devices have gained popularity due to their enhanced performance compared to conventional planar transistors. However, as semiconductor device sizes continue to get scaled down, the parasitics within FinFET or GAA devices may lead to potential problems.

In more detail, modern FinFET and/or GAA device fabrication may involve forming conductive contacts or vias to provide electrical connectivity to transistor components such as the gate or source/drain. As transistor sizes get smaller, the parasitic resistance and/or parasitic capacitance associated with the conductive contacts/vias may begin to dominate. Since the speed of transistor devices is correlated with an RC time constant (i.e., a product of resistance R and capacitance C), the increase in the parasitic resistance and/or capacitance may lead to a larger RC time constant and may slow down the speed of the transistor.

To address the problem discussed above, the present disclosure optimizes the profile of the conductive contact or via to alleviate the parasitic resistance and/or capacitance. As will be discussed below in more detail, the present disclosure optimizes an X-cut profile of the conductive contact/via by forming a large spacer layer to shrink the contact critical dimension (CD), which reduces the capacitance thereof, as well as enlarging the contact silicide area to reduce the parasitic resistance of the conductive contact. The present disclosure also optimizes a Y-cut profile of the conductive contact by configuring the conductive contact to have a tapered (e.g., trapezoidal) cross-sectional side view profile. Such a profile not only enlarges a landing window for another conductive via formed on the conductive contact, but it also enhances an electrical isolation or separation between the conductive contact and nearby components, which helps prevent undesirable electrical shorting.

Figure 1A:
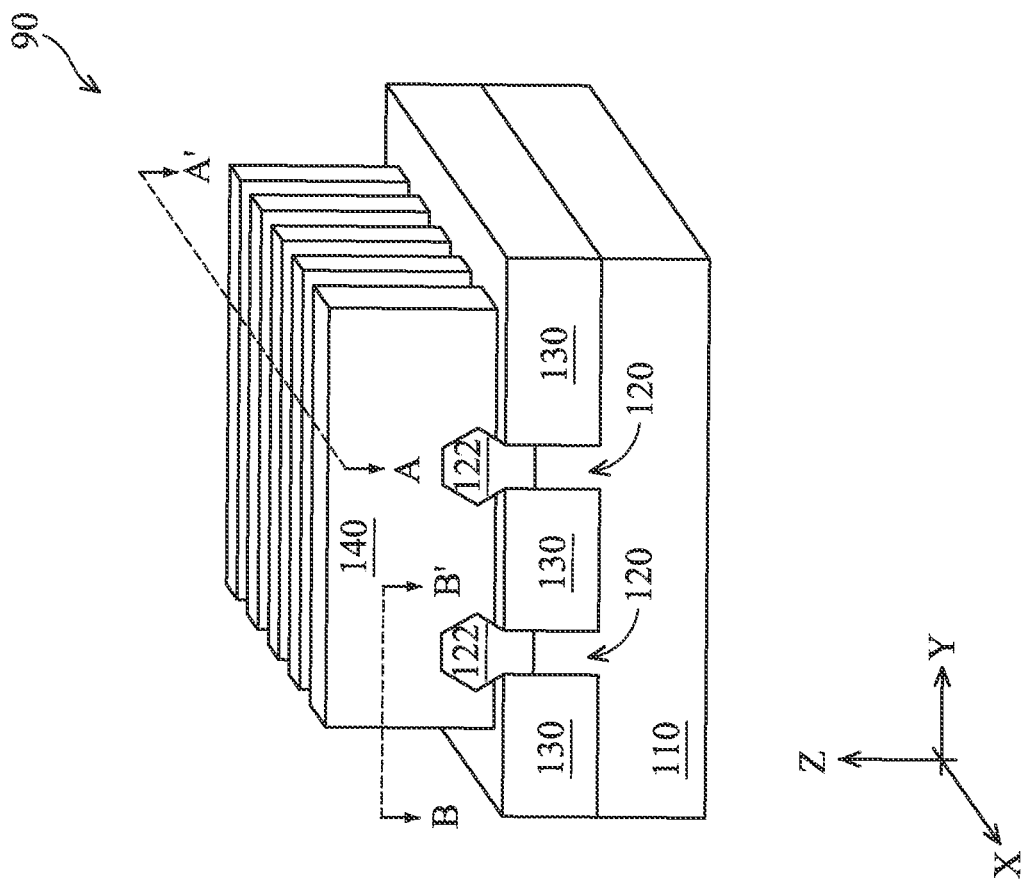
FIG. 1A illustrates a three-dimensional perspective view of a FinFET device.
Figure 1C:
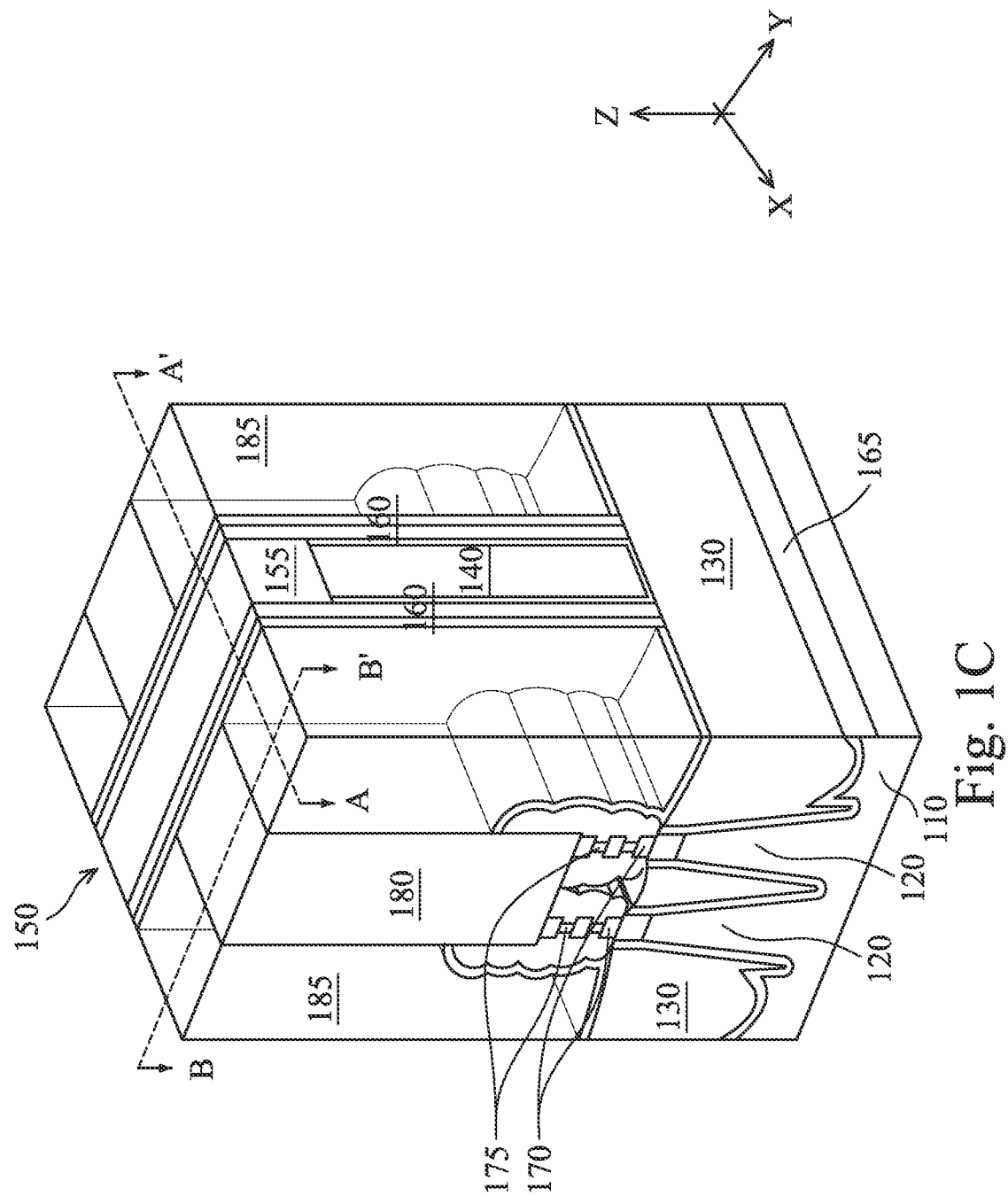
FIG. 1C illustrates a three-dimensional perspective view of a multi-channel gate-all-around (GAA) device.
Figure 9:
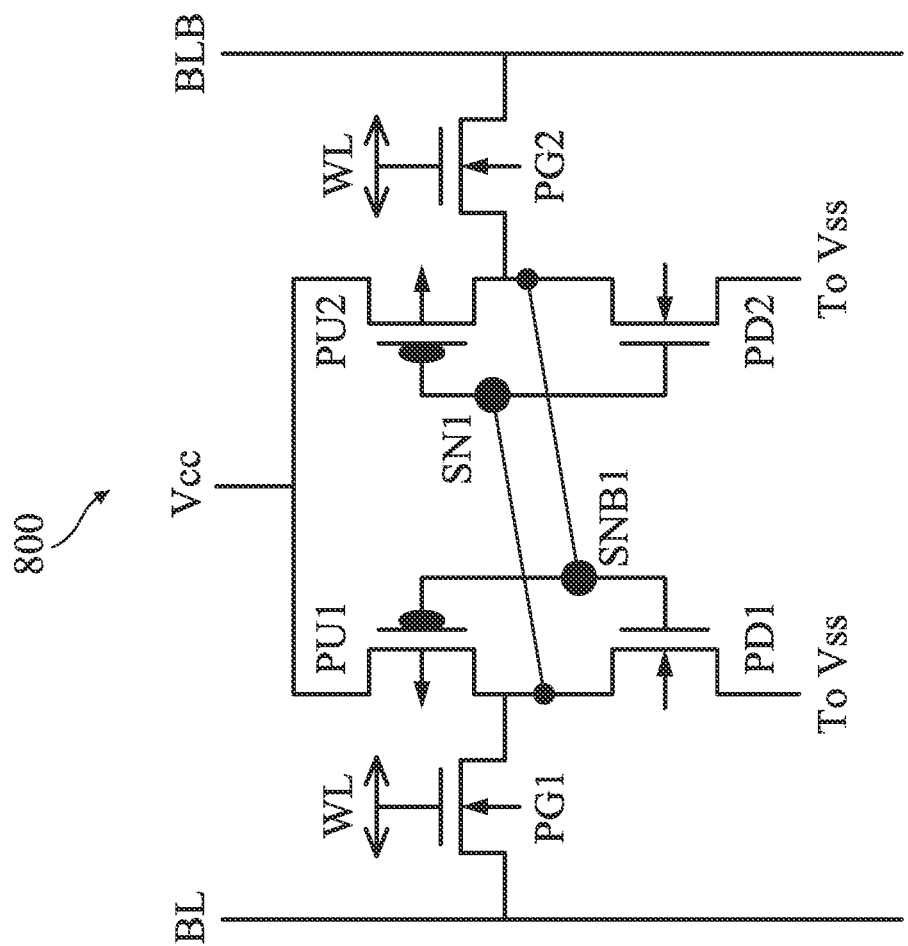
FIG. 9 illustrates a Static Random Access Memory (SRAM) cell according to an embodiment of the present disclosure.
Figure 10:
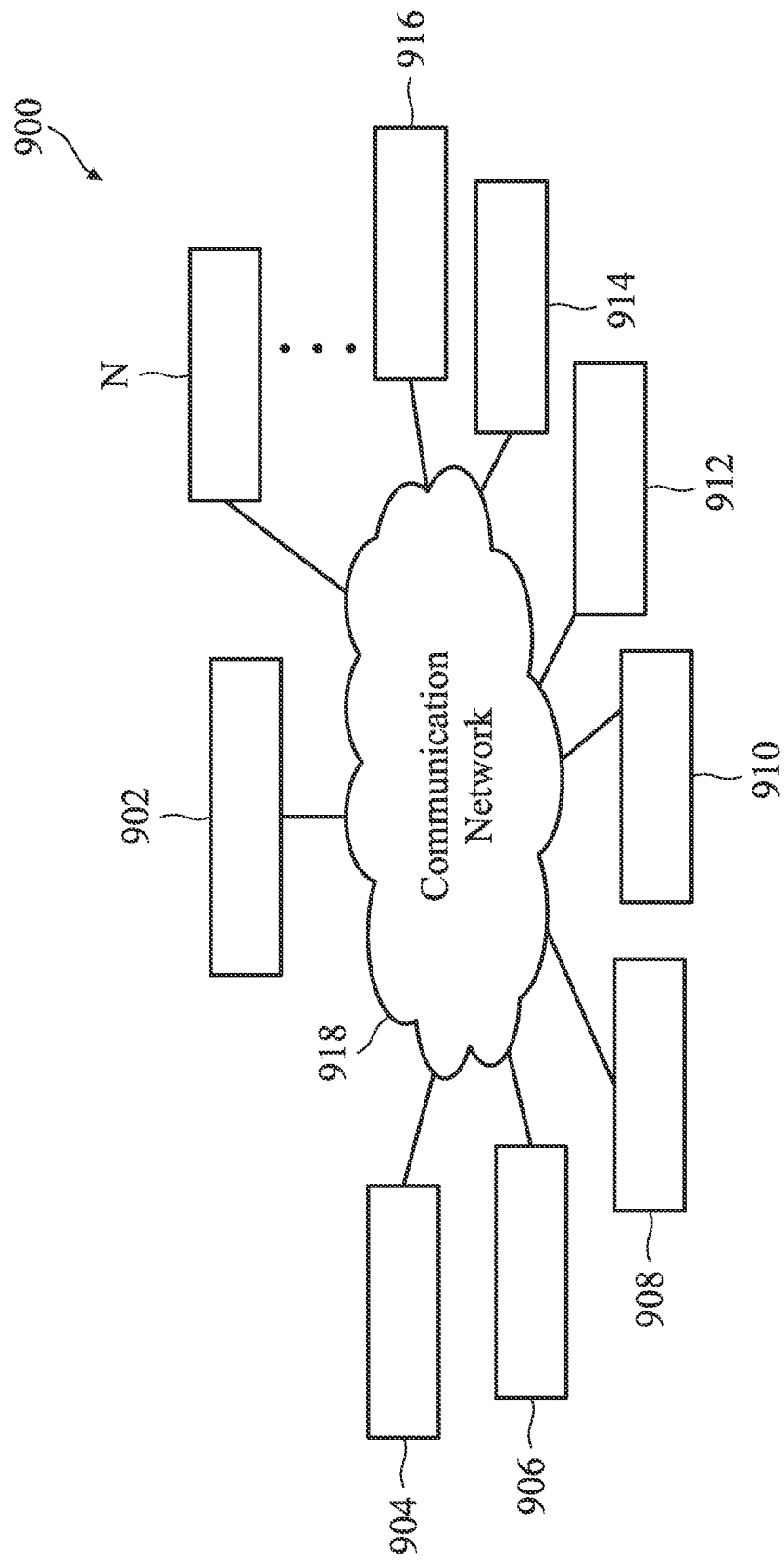
FIG. 10 illustrates an integrated circuit fabrication system according to an embodiment of the present disclosure.
Figure 11:
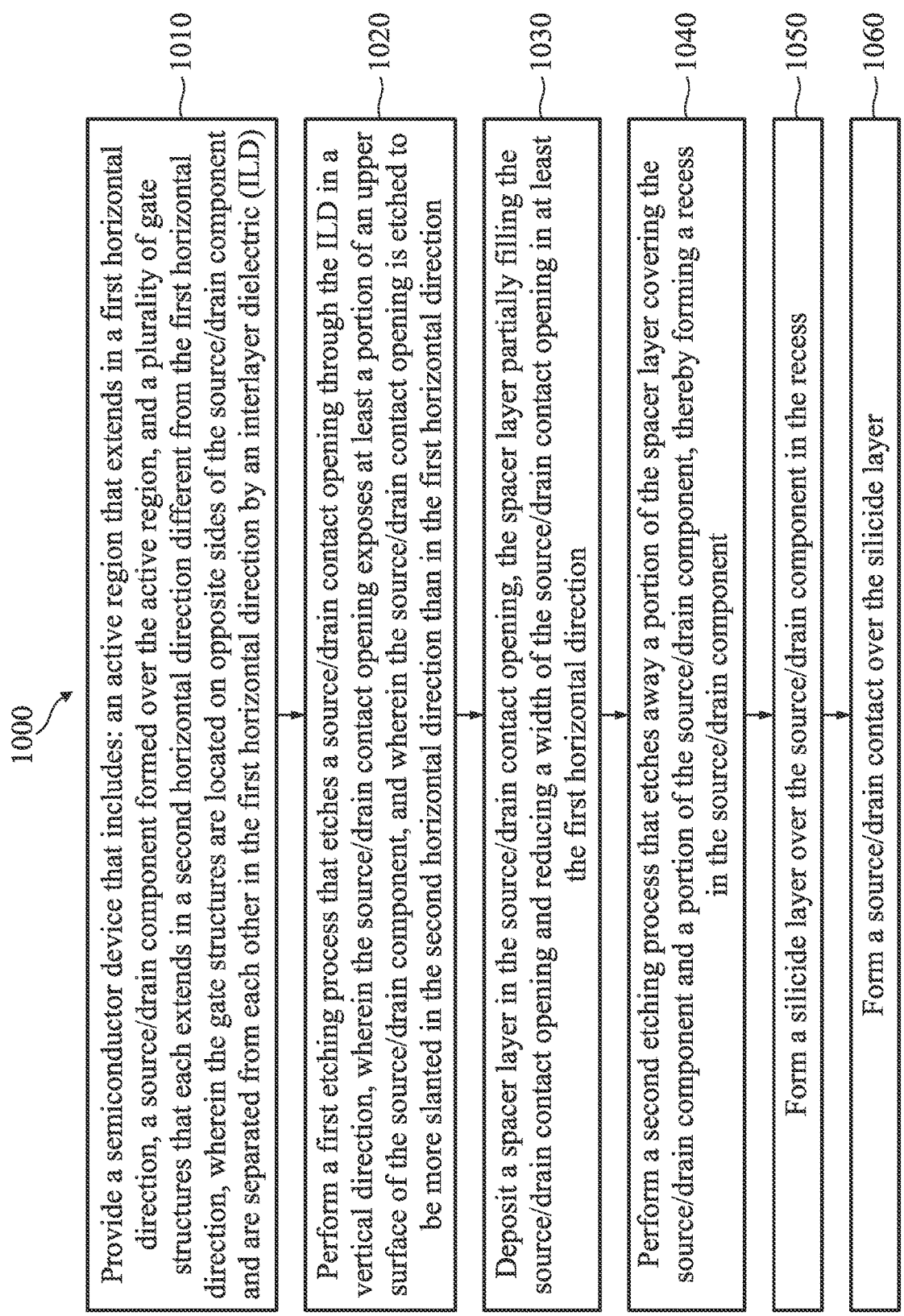
FIG. 11 illustrates flowchart of a method of fabricating a semiconductor device according to an embodiment of the present disclosure.

The various aspects of the present disclosure are now discussed below with reference to FIGS. 1A-1C, 2A-8A, 2B-8B, and 9-11. In more detail, FIGS. 1A-B illustrate an example FinFET device, and FIG. 1C illustrates an example GAA device. FIGS. 2A-8A and 2B-8B illustrate cross-sectional side views of an IC device at various stages of fabrication according to embodiments of the present disclosure. FIG. 9 illustrates a memory circuit as an example IC application implemented using IC devices fabricated according to the various aspects of the present disclosure. FIG. 10 illustrates an example semiconductor fabrication system. FIG. 11 illustrates a flowchart of a method of fabricating a semiconductor device.

Referring now to FIGS. 1A and 1B, a three-dimensional perspective view and a top view of a portion of an Integrated Circuit (IC) device 90 are illustrated, respectively. The IC device 90 is implemented using FinFETs. As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structure 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2A-5A and 8B-8B are diagrammatic fragmentary cross-sectional side views of a portion of an IC device 200 at various stages of fabrication according to embodiments of the present disclosure. Specifically, FIGS. 2A-8A are cross-sectional cuts taken along an X-direction, and therefore they are referred to as X-cut views. FIGS. 2B-8B are cross-sectional cuts taken along a Y-direction, and therefore they are referred to as Y-cut views. The example locations of the X-cut and the Y-cut are illustrated in FIGS. 1A-1C along a cutline A-A' and a cutline B-B', respectively.

Figure 2A:
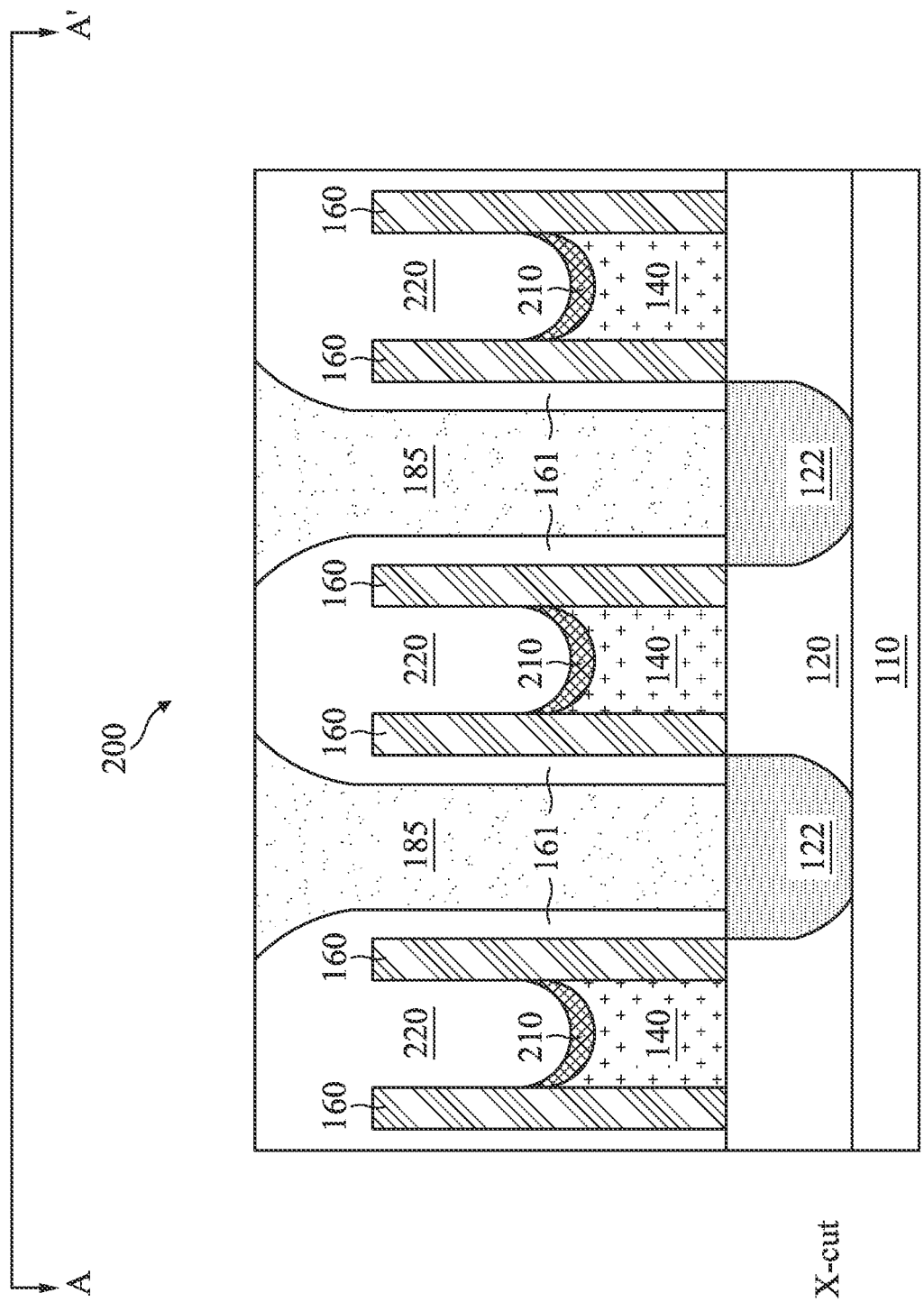
FIGS. 2A-2B, 3A-3B, 4A-4B, 5A-5B, 6A-6B, 7A-7B, and 8A-8B illustrate a series of cross-sectional views of a semiconductor device at various stages of fabrication according to embodiments of the present disclosure.
Figure 2B:
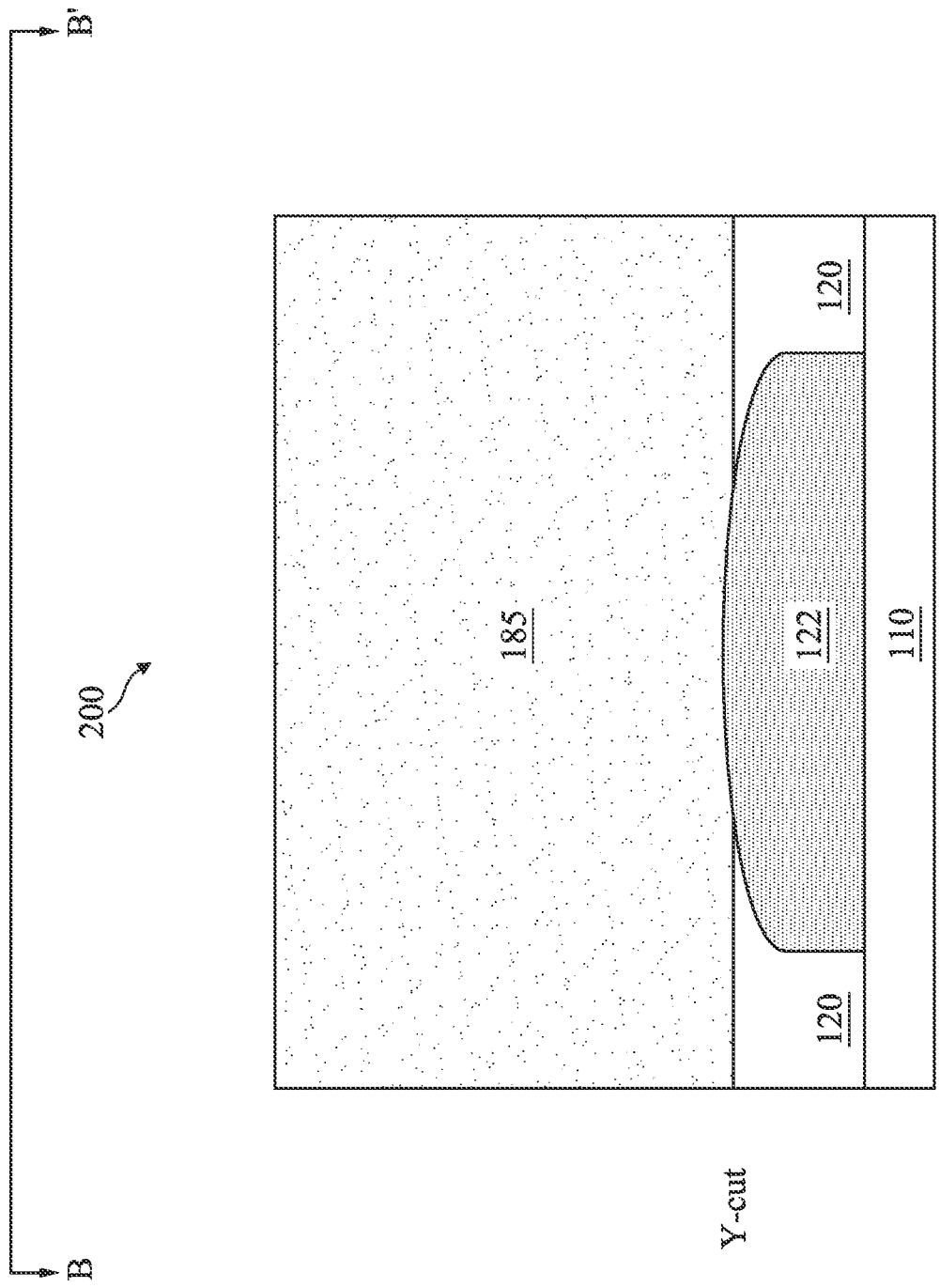

Referring to FIGS. 2A-2B, the IC device 200 includes the substrate 110 discussed above with reference to FIGS. 1A-1C, for example, a silicon substrate. A plurality of active regions may be formed by patterning the substrate 110. For example, the active regions may include the fin structures 120 discussed above with reference to FIGS. 1A-1B, or the nano-structures 170 discussed above with reference to FIG. 1C. For reasons of simplicity, the active regions are illustrated herein as fin structures 120, though it is understood that the concepts of the present disclosure apply to the GAA device with nano-structure active regions as well. In any case, the fin structures each 120 protrude vertically out of the substrate 110 in the Z-direction, and they each extend in horizontally in the X-direction, in the manner as shown in FIGS. 1A-1B.

Source/drain components 122 are formed over the fin structures 120. In some embodiments, the source/drain components 122 may include epi-layers that are epitaxially grown on the fin structures 120. The source/drain components 122 may include a semiconductive material, such as silicon in some embodiments, or silicon germanium in other embodiments.

The IC device 200 further includes a plurality of high-k metal gate (HKMG) structures 140. Each of the HKMG structures 140 may include a high-k gate dielectric and a metal-containing gate electrode. The high-k gate dielectric contains a high-k dielectric material, which refers to a dielectric material having a dielectric constant that is greater than a dielectric constant of silicon oxide (e.g., which is about 3.9). Example materials of the high-gate k dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal-containing gate electrode is formed over the high-k gate dielectric. The metal-containing gate electrode may include one or more work function (WF) metal layers and a fill metal layer. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as the main conductive portion of the metal-containing gate electrode. In some embodiments, the fill metal layer may include cobalt, tungsten, copper, aluminum, or alloys or combinations thereof. It is understood that each of the HKMG structures 140 may include additional layers, such as interfacial layers, capping layers, diffusion/barrier layers, or other applicable layers.

In some embodiments, each of the HKMG structures 140 is formed as a part of a gate replacement process, in which a dummy gate structure is formed first and subsequently replaced by the HKMG structure 140. In that regard, the initially-formed dummy gate structure may include a dummy gate dielectric (e.g., a silicon oxide gate dielectric) and a dummy polysilicon gate electrode. Gate spacers 160 are formed on sidewalls of the dummy gate structure. The gate spacers 160 may include a dielectric material, such as silicon oxide, silicon nitride, silicon oxynitride, silicon carbide, silicon oxycarbon nitride, etc. Gate spacers 161 are then formed on the sidewalls of the gate spacers 160. The gate spacers 160 may also include a dielectric material, such as silicon oxide, silicon nitride, silicon oxynitride, silicon carbide, silicon oxycarbon nitride, etc. In some embodiments, the gate spacers 160 and 161 have different material compositions, for example, one of them may contain silicon oxide, while the other one may contain nitride, or vice versa.

In some embodiments, the source/drain components 122 may by formed after the formation of the gate spacers 161, or after the formation of the gate spacers 160 but before the gate spacers 161. After the formation of the source/drain components 122, the ILD 185 may be formed around the dummy gate structures. The dummy gate structures are then removed (e.g., via one or more etching processes), thereby forming openings or recesses defined at least in part by the gate spacers 160. The HKMG structures 140 are then formed in the openings to replace the removed dummy gate structures. A planarization process, such as a chemical mechanical planarization (CMP) process, may then be performed to remove excess portions of the HKMG structures 140 and planarize the upper surfaces of the HKMG structures 140. The HKMG structures 140 may then be etched back, so as to reduce their height. A conductive capping layer 210 is then formed on the upper surface of each of the HKMG structures 140. In some embodiments, the conductive capping layer 210 includes a metal material, such as tungsten. The conductive capping layer 210 may help reduce the electrical resistance of the HKMG structure 140 and/or a gate contact to be formed on the HKMG structure 140. A mask layer 220 is also formed over the conductive capping layer 210. The mask layer 220 may include a dielectric material, for example a same type of dielectric material as the gate spacers 161.

Figure 3A:
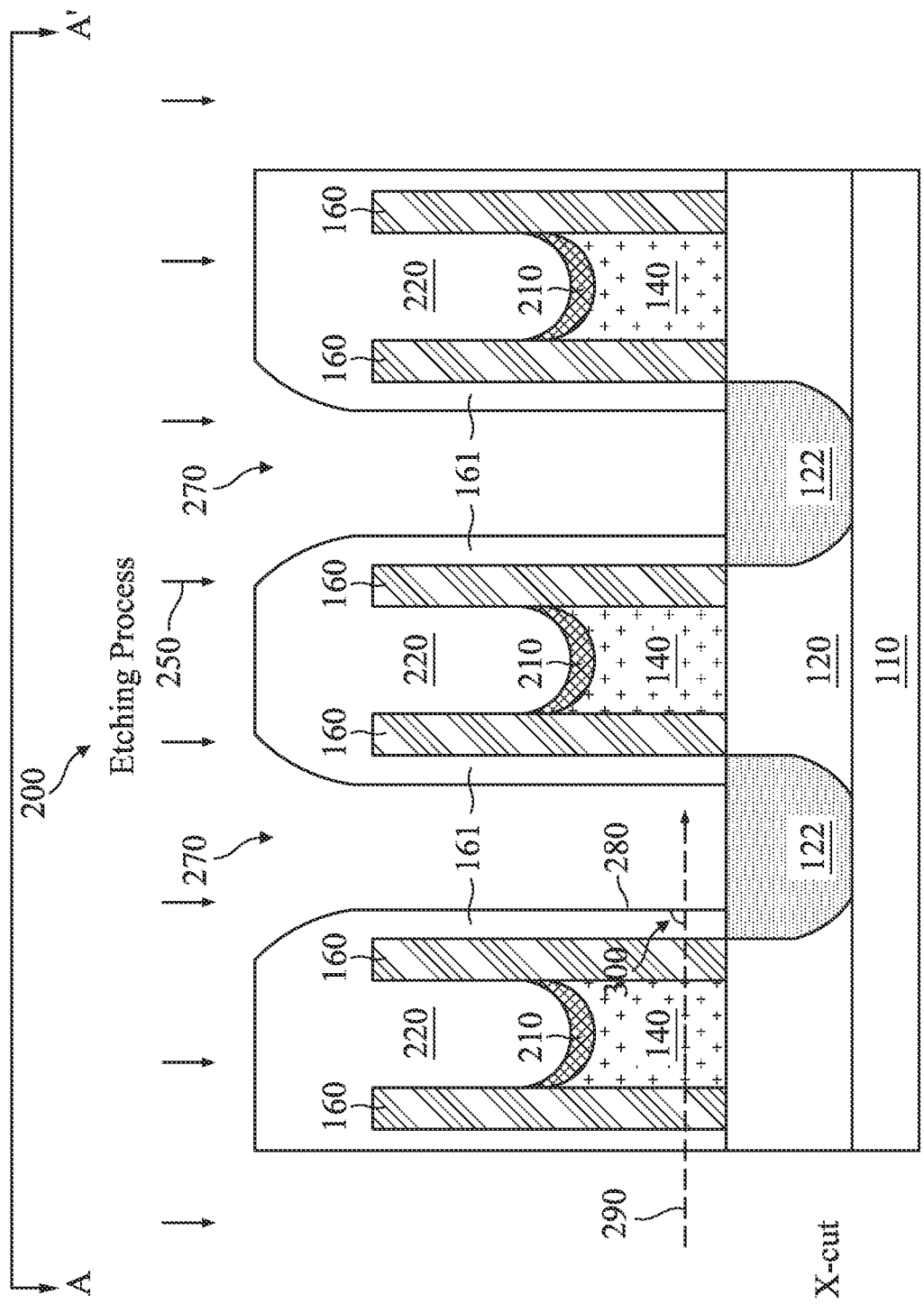
Figure 3B:
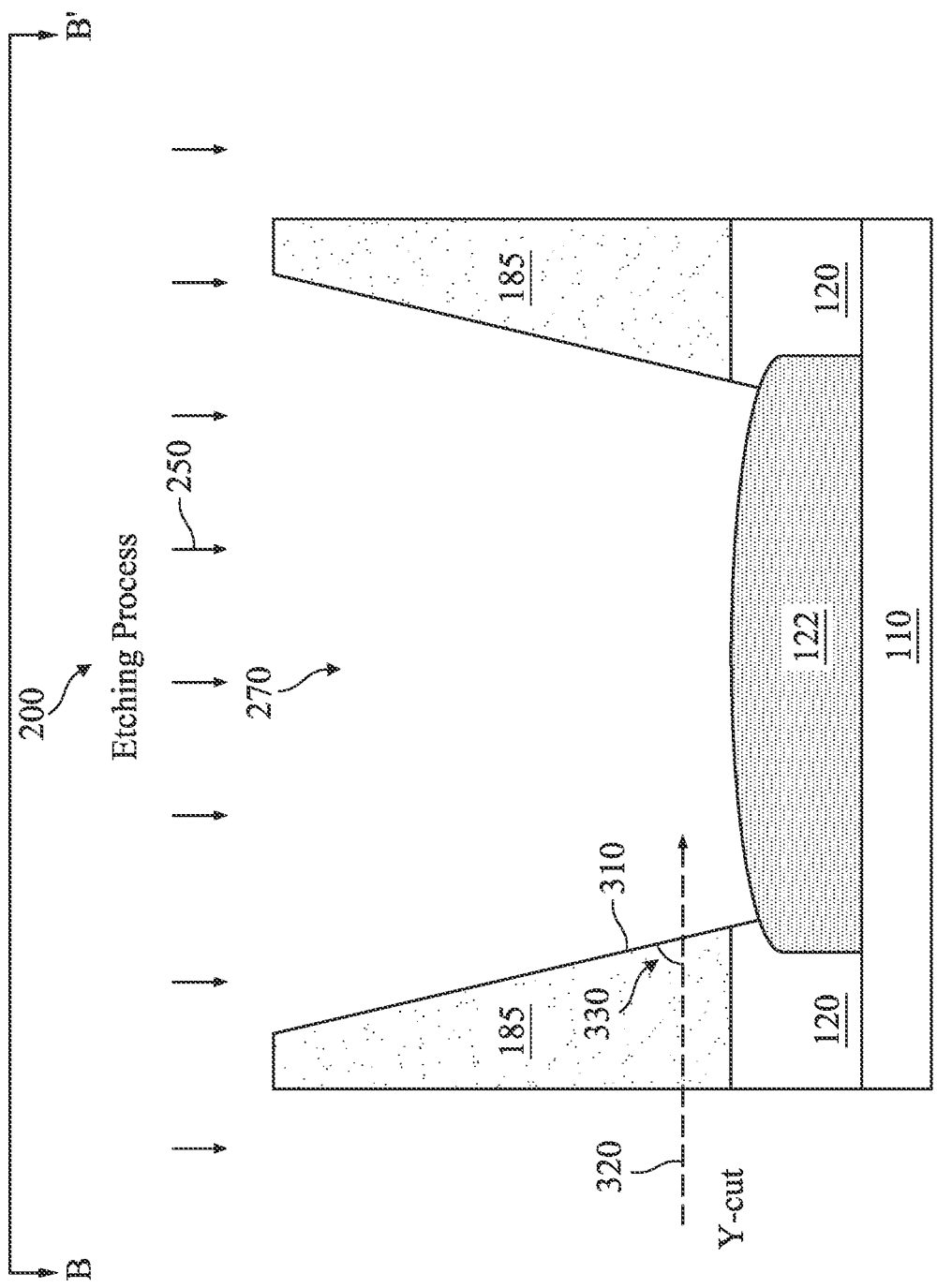

Referring now to FIGS. 3A-3B, an etching process 250 is performed to the IC device 200 to form source/drain contact openings 270. In some embodiments, the etching process is performed by increasing a contact etch gas flow of $C_4F_6$ (where $C_4F_6$ is used as the etching gas) as the etching process continues, by increasing the pressure of the etching chamber environment as the etching process continues, or by reducing the low frequency power of the etching process as the etching process continues, so as to achieve a tapered profile for the source/drain contact openings 270. The etching process 250 removes the portions of the ILD 185 formed over the upper surfaces of the source/drain components 122, thereby exposing at least portions of the upper surfaces of the source/drain components 122. As will be discussed below, the source/drain contact openings 270 will be filled by a conductive material in a later fabrication process step to form conductive source/drain contacts that provide electrical connectivity to the source/drain components 122.

According to various aspects of the present disclosure, the etching process 250 is configured to create a slanted (or tapered) sidewall profile for the source/drain contact openings 270. In other words, the source/drain contact opening 270 has a maximum horizontal dimension at or near the top, and the horizontal dimension gradually shrinks or decreases as a function of the depth of the source/drain contact opening 270, such that the minimum horizontal dimension of the source/drain contact opening 270 occurs at or near the bottom of the source/drain contact opening 270. As such, it may also be said that the source/drain contact opening 270 each has a trapezoidal profile in a cross-sectional side view, which is visibly apparent in the Y-cut cross-sectional side view of FIG. 3B, though it is understood that such a profile may also exist in the X-cut cross-sectional side view of FIG. 3A, but to a lesser extent. Again, such a slanted or tapered profile can be achieved by carefully configuring the parameters of the etching process 250, for example, by increasing the flow rate of the etching gas, by increasing the pressure of the etching chamber, or by reducing the low frequency power, as the etching process continues.

According to embodiments of the present disclosure, the sidewall of the source/drain contact openings 270 is also more slanted in the Y-cut cross-sectional side view than in the X-cut cross-sectional side view. Alternatively stated, the source/drain contact opening 270 is more tapered in the Y-direction than in the X-direction. For example, as shown in the X-cut view of FIG. 3A, a sidewall 280 of the source/drain contact opening 270 (which is also a side surface of the gate spacer 161) and a horizontal plane 290 (represented by a dashed arrow extending in the X-direction) may collectively define a slant angle 300. In some embodiments, the slant angle 300 is in a range between about 85 degrees and about 90 degrees. Meanwhile, as shown in the Y-cut view of FIG. 3B, a sidewall 310 of the source/drain contact opening 270 (which is also a side surface of the ILD 185) and a horizontal plane 320 (represented by a dashed arrow extending in the Y-direction) may collectively define a slant angle 330. In some embodiments, the slant angle 330 is in a range between about 70 degrees and about 80 degrees, which is substantially smaller than the slant angle 300 in the X-cut. In other words, the smaller slant angle 330 (compared to the slant angle 300) means that the source/drain contact opening 270 is more slanted or more tapered in the Y-direction than in the X-direction. The difference in the slant angles 300 and 330 may be attributed to the fact that the slant angle 300 is defined by the gate spacers 161 as a result of self-aligned contact etching, whereas the slant angle 330 is defined by specifically configuring the etching process parameters of the etching process 250 to cause the slant angle 330 to form. In other words, the present disclosure purposefully etches a trapezoidal shaped source/drain contact opening 270 in the Y-cut, but such as trapezoidal profile is not necessarily aimed for the source/drain contact opening 270 in the X-cut.

It is noted that such a top-wide-bottom-narrow cross-sectional side view profile of the source/drain contact opening 270 is one of the unique physical characteristics of the IC device 200. Conventional IC devices may lack such a profile. As will be explained in more detail below, such a slanted or tapered cross-sectional side view profile of the source/drain contact opening 270 is beneficial, as it will help increase a landing window for source/drain vias (to be formed over the source/drain contacts), as well as enhance an electrical isolation between the source/drain contact and other nearby components, such as other source/drain components located close to the source/drain contacts.

Figure 4A:
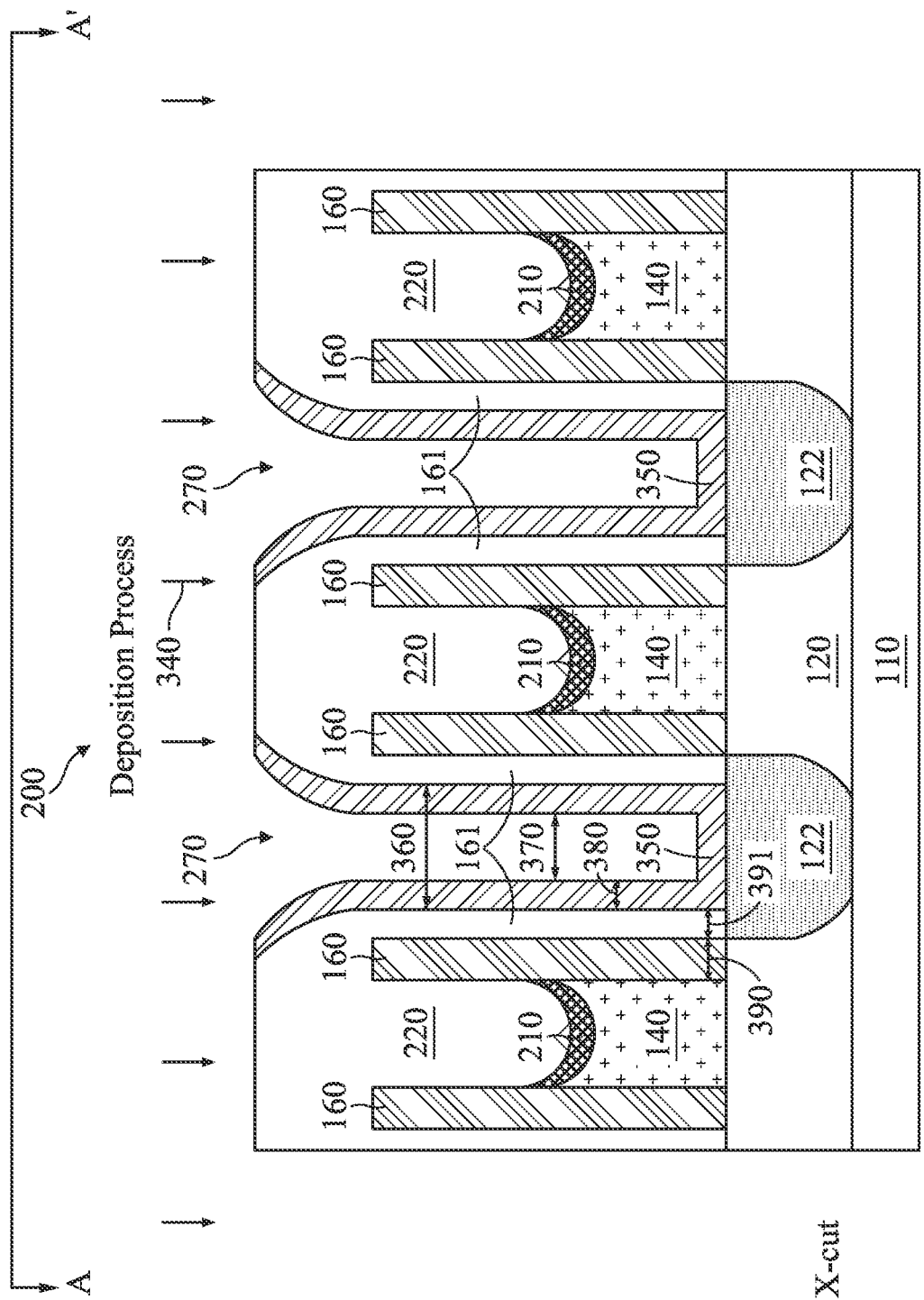
Figure 4B:
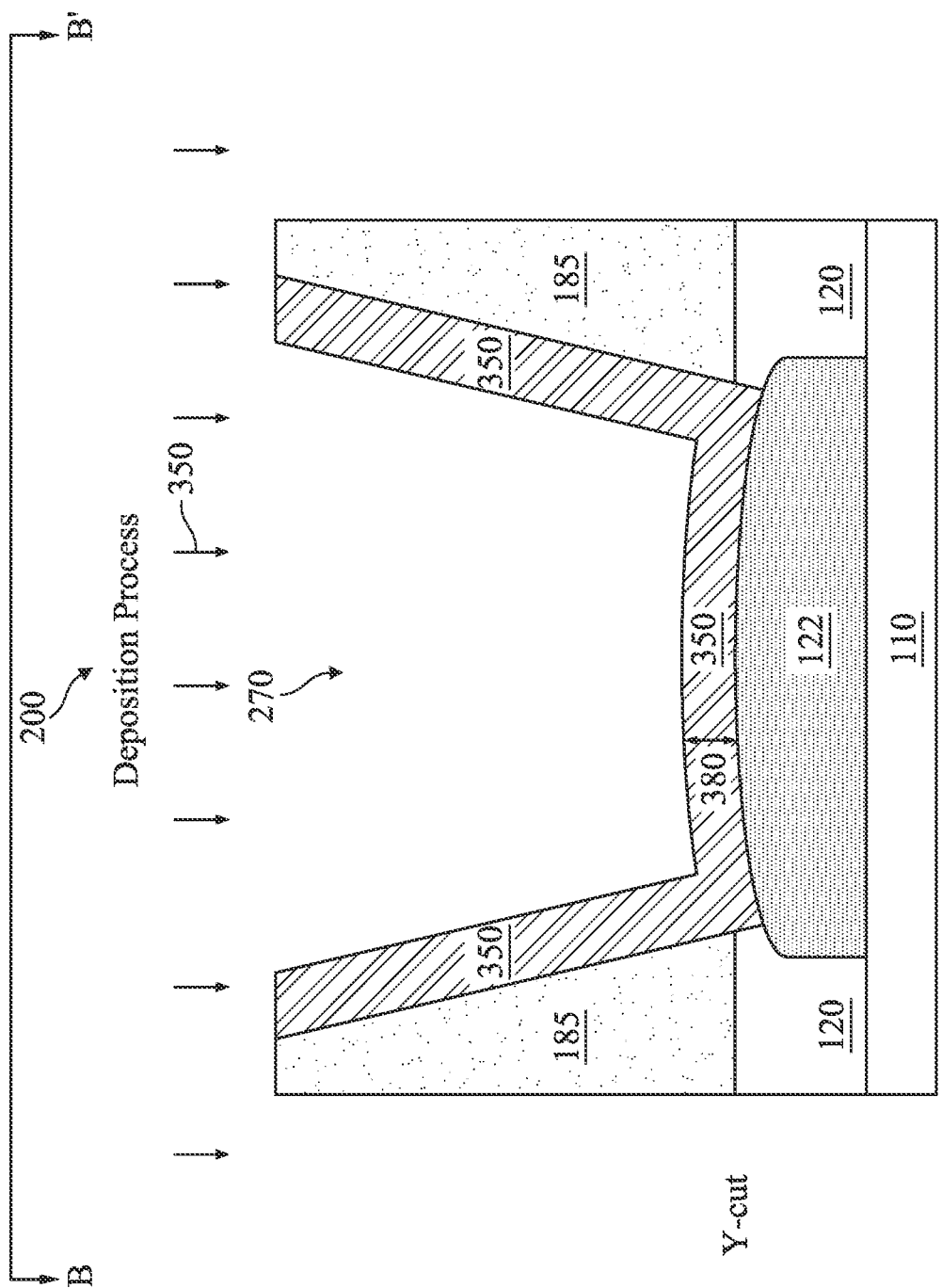

Referring now to FIGS. 4A-4B, a deposition process 340 is performed to the IC device 200 to form a gate spacer layer 350. The gate spacer layer 350 is formed on the sidewalls of the gate spacers 161 and over the exposed upper surfaces of the source/drain components 122. The gate spacer layer 350 is deposited as a dielectric material, such as silicon oxide ($SiO_2$), silicon nitride (SiN), silicon oxynitride (SiON), silicon oxycarbide (SiOC), silicon carbon nitride (SiCN), silicon oxycarbon nitride (SiOCN), etc. In some embodiments, the material composition of the gate spacer layer 350 is different from that of the gate spacers 161, and/or from that of the gate spacers 160. For example, in some embodiments, the gate spacers 161 may have a silicon nitride material composition, while the gate spacer layer 350 has a non-silicon-nitride dielectric material composition.

The formation of the gate spacer layer 350 reduces the width (also referred to as a critical dimension) of the source/drain contact opening 270. For example, as shown in FIG. 4A, whereas the source/drain contact opening 270 may have an average horizontal dimension 360 (e.g., averages of different horizontal dimension values over an entire vertical length of the source/drain contact opening 270) before the gate spacer layer 350 is deposited, the formation of the gate spacer layer 350 reduces such a horizontal dimension 360 down to an average horizontal dimension 370, where the average horizontal dimensions 360 and 370 are each measured in the X-direction.

According to various aspects of the present disclosure, the gate spacer layer 350 helps to reduce the parasitic capacitance of the IC device 200. In more detail, the source/drain contact opening 270 will be filled with a conductive material in a later fabrication step to form source/drain contacts therein. The source/drain contact and the nearby metal gate electrode of the HKMG structures may serve as two conductive plates of a parasitic capacitor. The gate spacers layer 350, along with the gate spacers 160-161, may serve as the dielectric material between the two conductive plates of such a parasitic capacitor. Parasitic capacitance is directly correlated with an RC time constant of the IC device 200, as it contributes to the capacitance portion of the RC time constant. As parasitic capacitance increases, so does the RC time constant, which slows down the speed of the IC device 200. Here, the implementation of the gate spacers 350 effectively increases the distance between the two conductive plates (e.g., the metal gate electrode and the to-be-formed source/drain contact) of the parasitic capacitor. Since capacitance is inversely related to the distance between the two conductive plates, parasitic capacitance is reduced as a result of the implementation of the gate spacer layer 350. Beneficially, the speed of the IC device 200 may be improved. To the extent that conventional IC devices may include a spacer or dielectric material similar to the gate spacer layer 350, the gate spacer layer 350 of the present disclosure is formed to be substantially thicker (or wider in the X-direction) than the spacer of the conventional IC devices. Again, the thickened or widened gate spacer layer 350 helps to length the distance between the two conductive plates of the parasitic capacitor, which in turns reduces the parasitic capacitance.

In some embodiments, the deposition process 340 includes an ALD process, so that a thickness 380 of the gate spacer layer 350 can be precisely controlled. In some embodiments, the thickness 380 is configured to be in a range between about 3 nanometers (nm) and about 6 nm. However, it is noted that the thickness 380 in the Y-cut of FIG. 4B has a greater value than the thickness 380 in the X-cut. For example, in some embodiments where the thickness 380 is around 3 nm in the X-cut, the thickness 380 may be around 5-6 nm in the Y-cut. Such a difference may be a result of an X-cut critical dimension shrinkage at the contact end, which may cause a merger of the gate spacer layer 350 in the Y-cut.

The thickness 380 of the gate spacer layer 350 may also be expressed as a function (or a ratio) of the thicknesses of the gate spacers 160 or 161. For example, the gate spacers 160 and 161 may have thicknesses (measured in the X-direction in FIG. 4A) 390 and 391, respectively. The thickness 380 may be greater than at least one of the thicknesses 390 or 391. In other words, the gate spacer layer 350 is thicker than at least one of the gate spacers 160 or 161 in the X-direction. In some embodiments, a ratio of the thickness 380 and the thickness 390 is in a range between about 1.1:1 and about 1.3:1. In some embodiments, a ratio of the thickness 380 and the thickness 391 is in a range between about 0.65:1 and about 0.85:1. The thickness 380 of the gate spacer layer 350 may also be expressed as a function (or a ratio) of the horizontal dimension 370 of the source/drain contact opening 270. In some embodiments, a ratio of the thickness 380 and the horizontal dimension 370 is in a range between about 0.2:1 and about 0.3:1. The above ranges are not randomly chosen, but rather specifically configured to ensure that the gate spacer layer 350 is sufficiently thick to increase the spacing between the metal gate electrode of the HKMG structure 140 and the to-be-formed source/drain contact (i.e., the two conductive plates of a parasitic capacitor), while at the same time not shrink the horizontal dimension 370 down too much, to the point where gap filling may be difficult during the formation of the source/drain contacts.

Figure 5A:
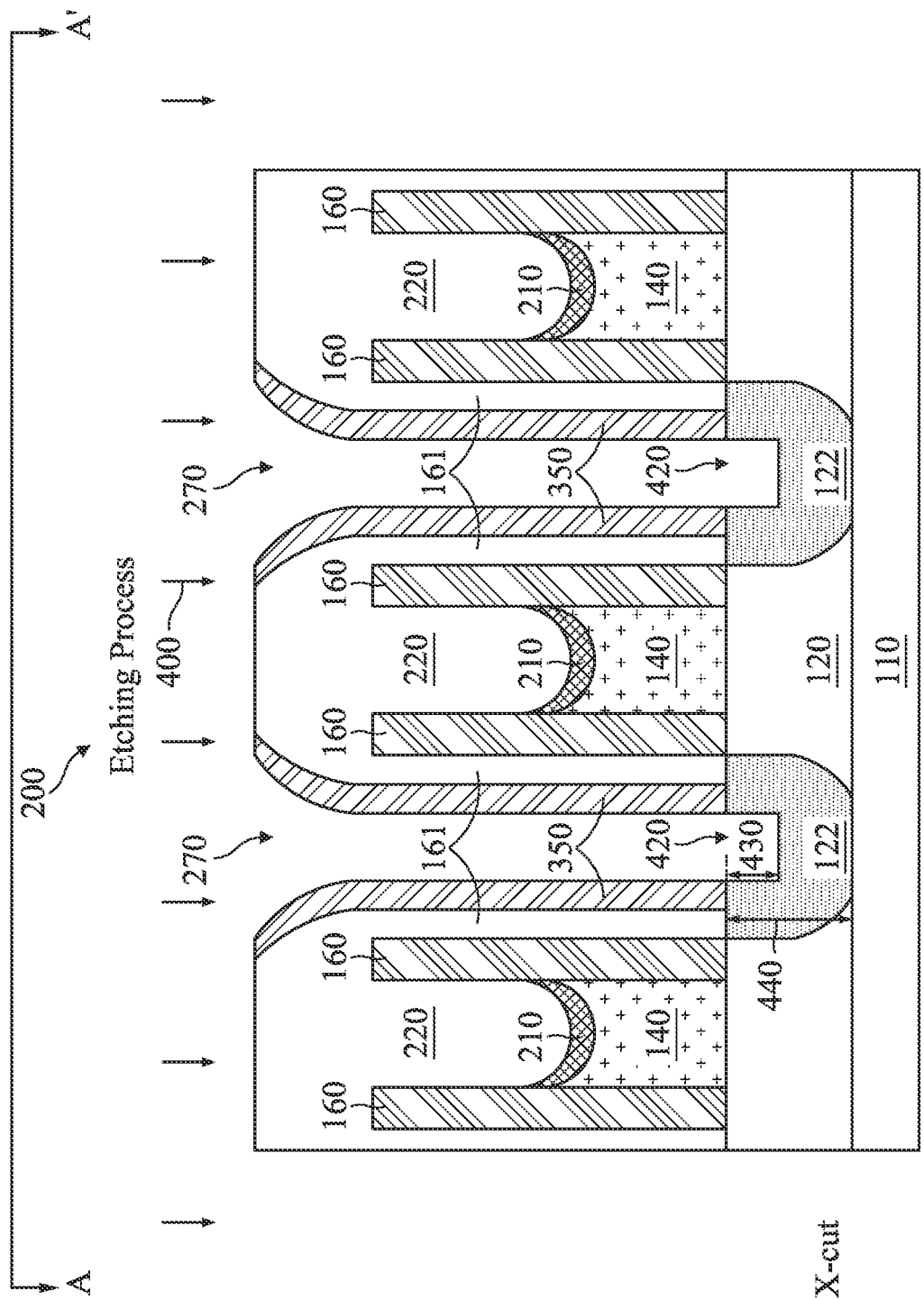
Figure 5B:
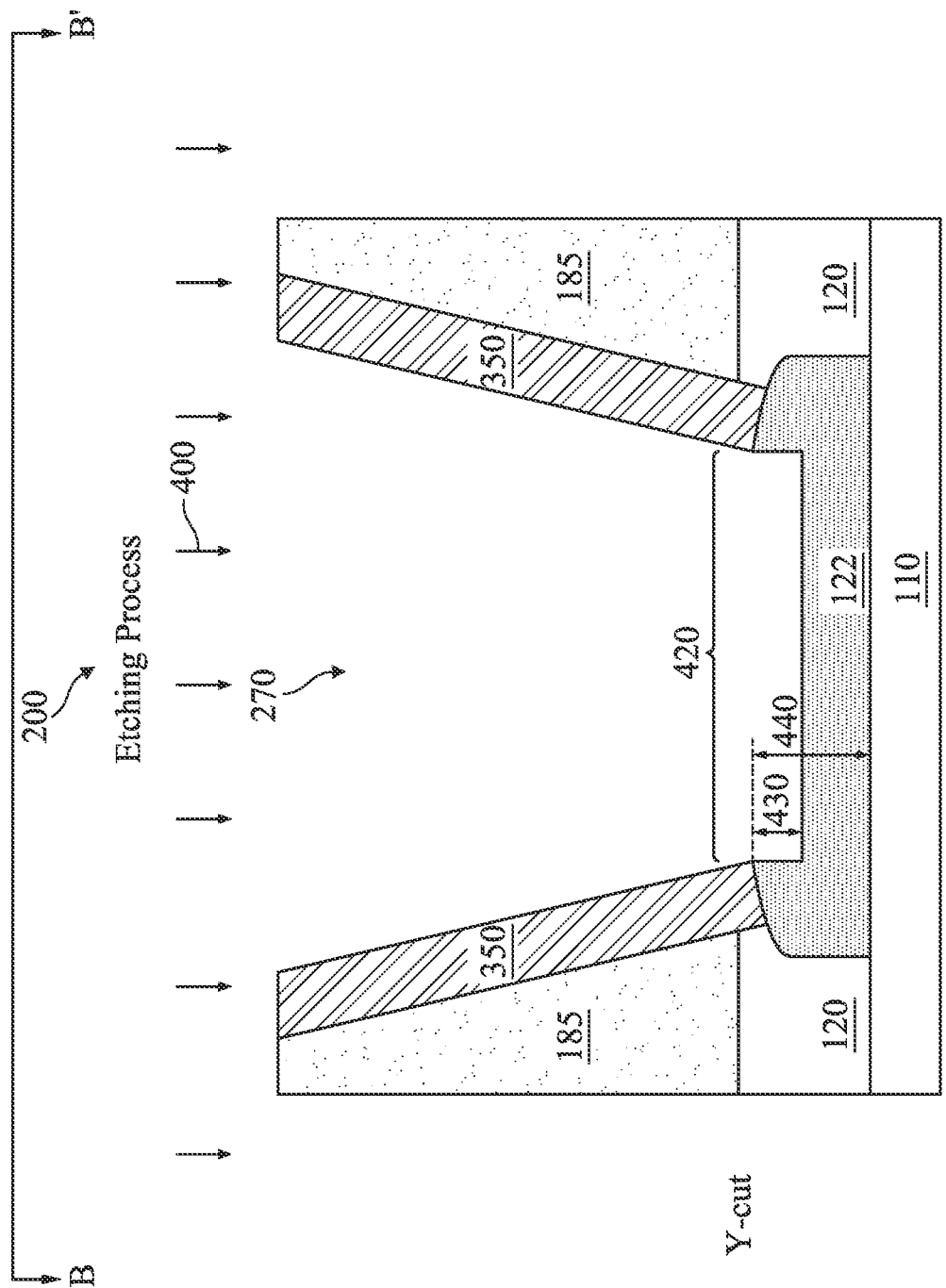

Referring now to FIGS. 5A-5B, an etching process 400 is performed to extend the source/drain contact opening 270 further downward in the Z-direction. In some embodiments, the etching process 400 includes an anisotropic dry etching process. The etching process 400 removes portions of the gate spacer layer 350 covering the source/drain components 122. As a result, gate spacers 350 are formed on the sidewalls of the gate spacers 161 by the remaining portions of the gate spacer layer 350. The etching process 400 further etches away portions of the source/drain components 122. As a result, a recess 420 is formed in each of the source/drain components 122. The recess 420 may be viewed as an extension of the source/drain contact opening 270, since it is connected to the rest of the source/drain contact opening 270. The recess 420 has a depth 430 measured in the Z-direction, which is smaller than the depth 440 (also measured in the Z-direction) of the source/drain component 122. In some embodiments, a ratio of the depth 430 and the depth 440 is in a range between about 1:2 and about 1:5. In some embodiments, the depth 430 is in a range between about 5 nm and about 15 nm. The etching of the source/drain components 122 is one of the unique processing steps of the present disclosure, as the resulting recess 420 allows for a great surface contact area for a silicide layer to be formed therein, as will be discussed in more detail below.

Figure 6A:
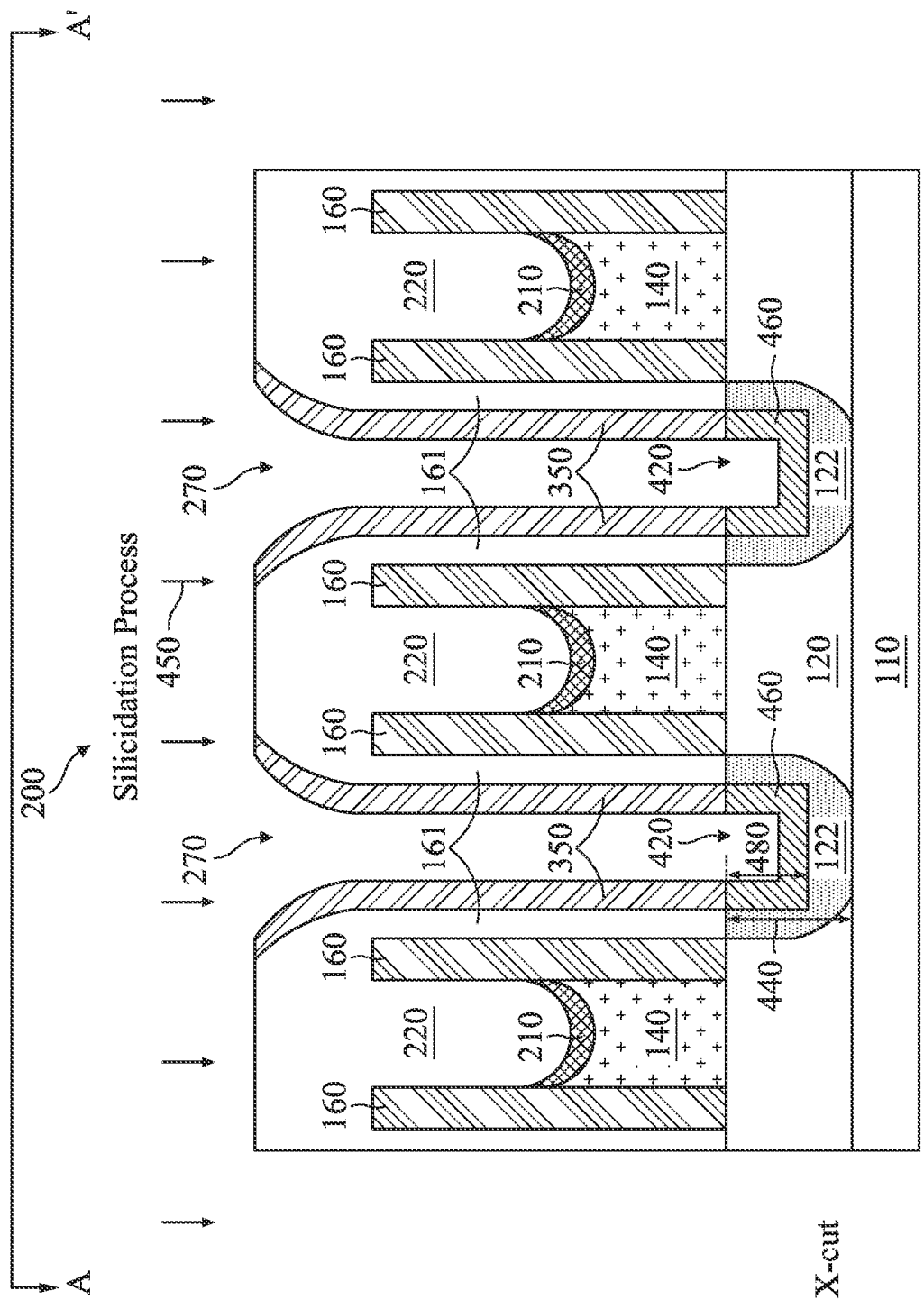
Figure 6B:
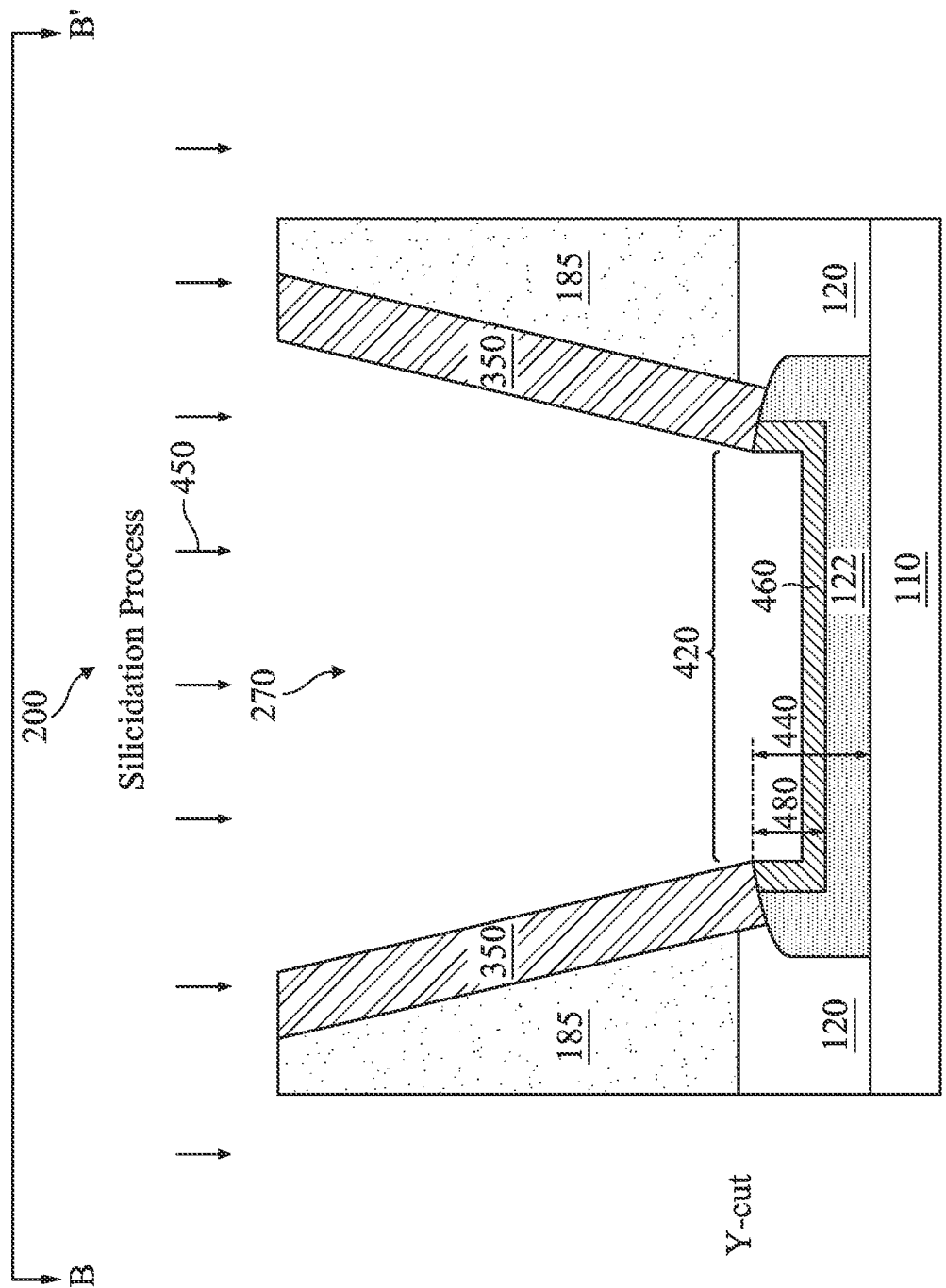

Referring now to FIGS. 6A-6B, a silicidation process 450 is performed to the IC device 200 to form a silicide layer 460 on the source/drain components 122 in the recess 420. In some embodiments, the silicidation process 450 includes a metal deposition process, in which one or more metal materials such as titanium and/or nickel are deposited on the exposed upper surfaces of the source/drain components 122 in the recess 420. The silicidation process 450 may also include a thermal process such as an annealing process, in which the deposited metal materials react with the semiconductive materials below (e.g., materials of the source/drain components 122) to form the silicide layer 460. As non-limiting examples, the resulting silicide layer 460 may include titanium silicide (TiSi), nickel silicide (NiSi), titanium nickel silicide (TiNiSi), or nickel titanium silicide (NiTiSi).

The silicide layer 460 does not completely fill the recess 420. Rather, the silicide layer 460 substantially inherits the shape or cross-sectional profile of the recess 420, and as such, still defines the recess 420 with its upper surface and side surfaces. For example, the silicide layer 460 may have a depth 480 measured in the Z-direction. The depth 480 is measured from the topmost point of the silicide layer 460 (e.g., at an interface between the silicide layer 460 and the gate spacers 350) to the bottom surface of the silicide layer 460. The depth 480 indicates how deep or far the silicide layer 460 protrudes vertically downward into the source/drain components 122. The depth 480 is also smaller than the depth 440 of the source/drain component 122. In some embodiments, a ratio of the depth 480 and the depth 440 is in a range between about 1:2 and about 1:5. In some embodiments, the depth 430 is in a range between about 5 nm and about 15 nm.

As shown in FIGS. 6A-6B, the shape or cross-sectional profile of the silicide layer 460 may resemble a letter "U." Such a profile of the silicide layer 460 is one of the unique physical characteristics of the present disclosure. Advantageously, such a profile allows the silicide layer 460 to have an increased surface area, because the silicide layer 460 not only has a planar upper surface, but also side surfaces due to itself being downwardly recessed. When a source/drain contact is formed on the silicide layer 460 in a subsequent processing step, the source/drain contact comes into direct physical contact with both the planar upper surface and the side surfaces of the silicide layer 460, which reduces parasitic electrical resistance associated with the source/drain contact. In comparison, conventional IC devices typically have a flat planar silicide layer (if one is formed at all), which has a smaller contact surface area with the source/drain contact than that of the IC device 200. As such, conventional IC devices may have a greater parasitic electrical resistance, which in turns slows down IC device speed.

Figure 7A:
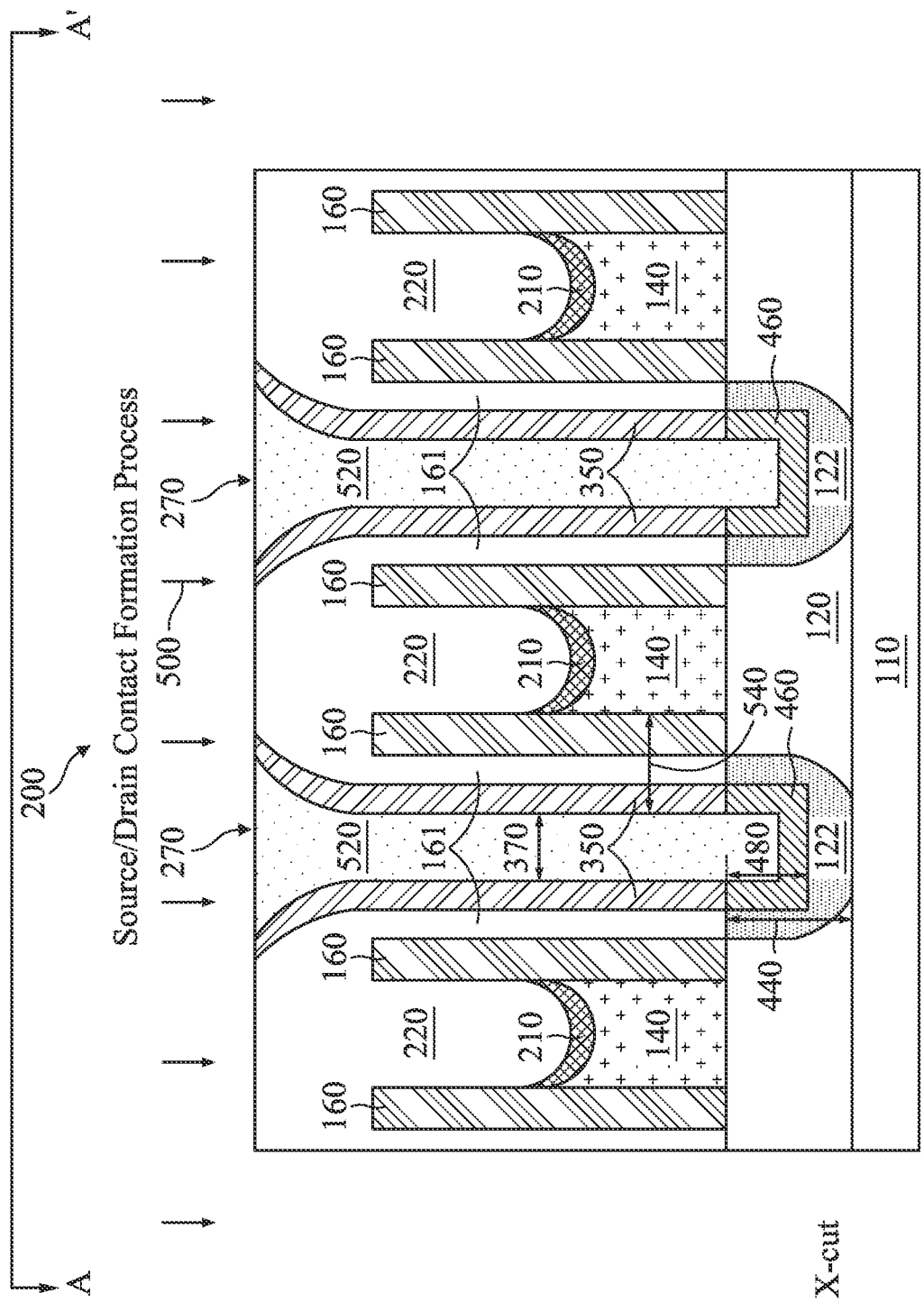
Figure 7B:
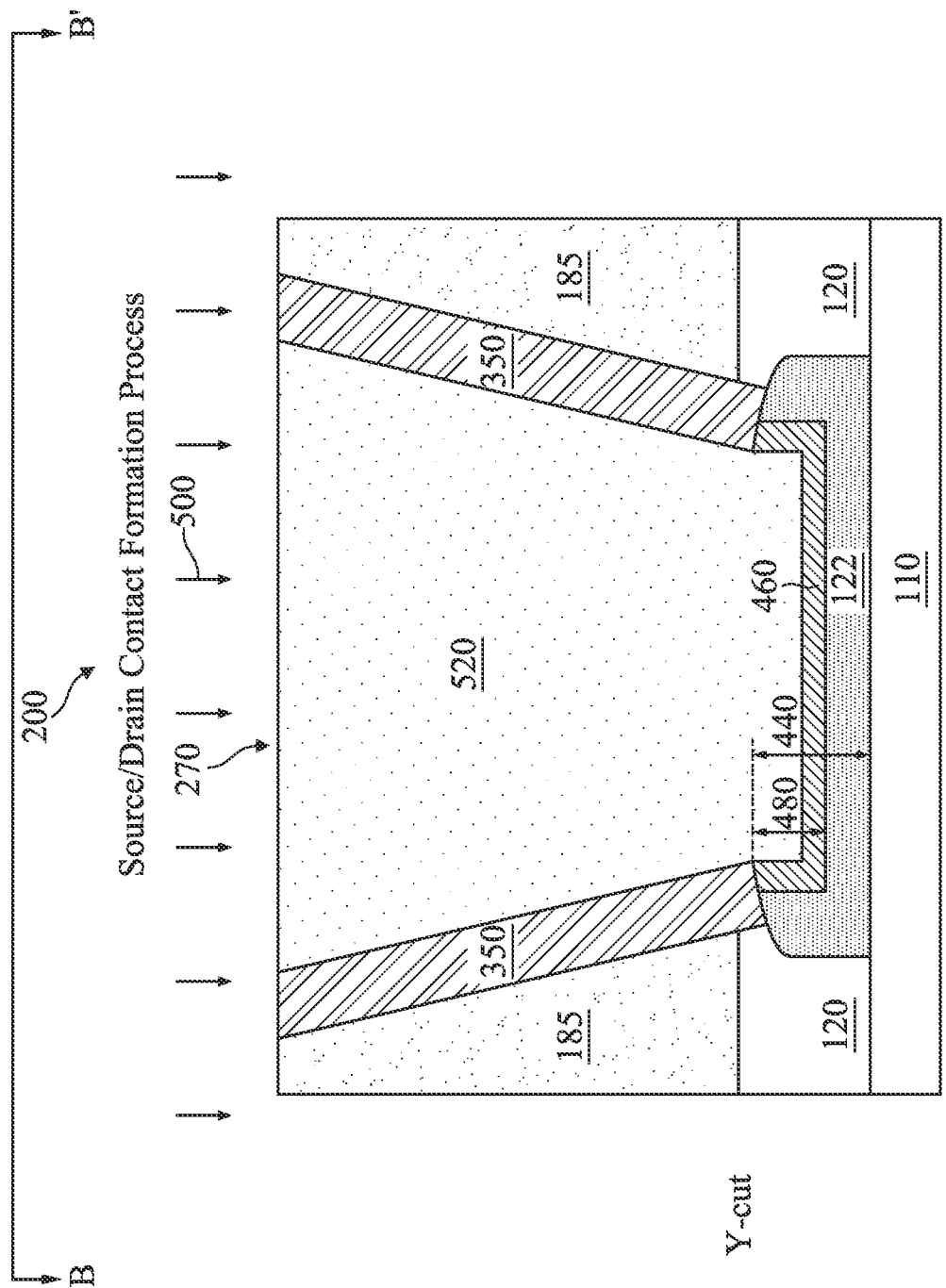

Referring now to FIGS. 7A-7B, a source/drain contact formation process 500 is performed to form a source/drain contact 520 in each of the source/drain contact openings 270. In some embodiments, the source/drain contact formation process 500 includes a deposition process, in which a conductive material is deposited to completely fill each of the source/drain contact openings 270. The conductive material may include cobalt, ruthenium, nickel, tungsten, copper, aluminum, titanium, or combinations thereof. The source/drain contact formation process 500 may also include a polishing process (e.g., a CMP process) to remove excess portions of the conductive material deposited outside of the source/drain contact openings 270 and to planarize the upper surface of the deposited conductive material with the rest of the layers, such as the ILD 185, the gate spacers 350, and the mask layer 220.

As a result of the above processes, source/drain contacts 520 are formed in the source/drain contact openings 270. As discussed above, the unique shape/profile of the silicide layer 460 allows it to form interfaces not only with a bottom surface of the source/drain contact 520, but also with portions of the side surfaces of the source/drain contact 520 as well. As a result of this enlarged surface contact area between the source/drain contact 520 and the silicide layer 460, parasitic electrical resistance is reduced, which in turn improves the speed of the IC device 200. In addition, since the horizontal dimension 370 of the source/drain contact 520 is reduced via the implementation of a thick/wide gate spacer layer 350, a distance 540 between the source/drain contact 520 and its nearby HKMG structure 140 (i.e., the distance between two conductive plates of a parasitic capacitor) is increased. As discussed above, such an increase in the distance 540 reduces the parasitic capacitance of the IC device 200, which in turn improves time delay and/or device speed.

Figure 8A:
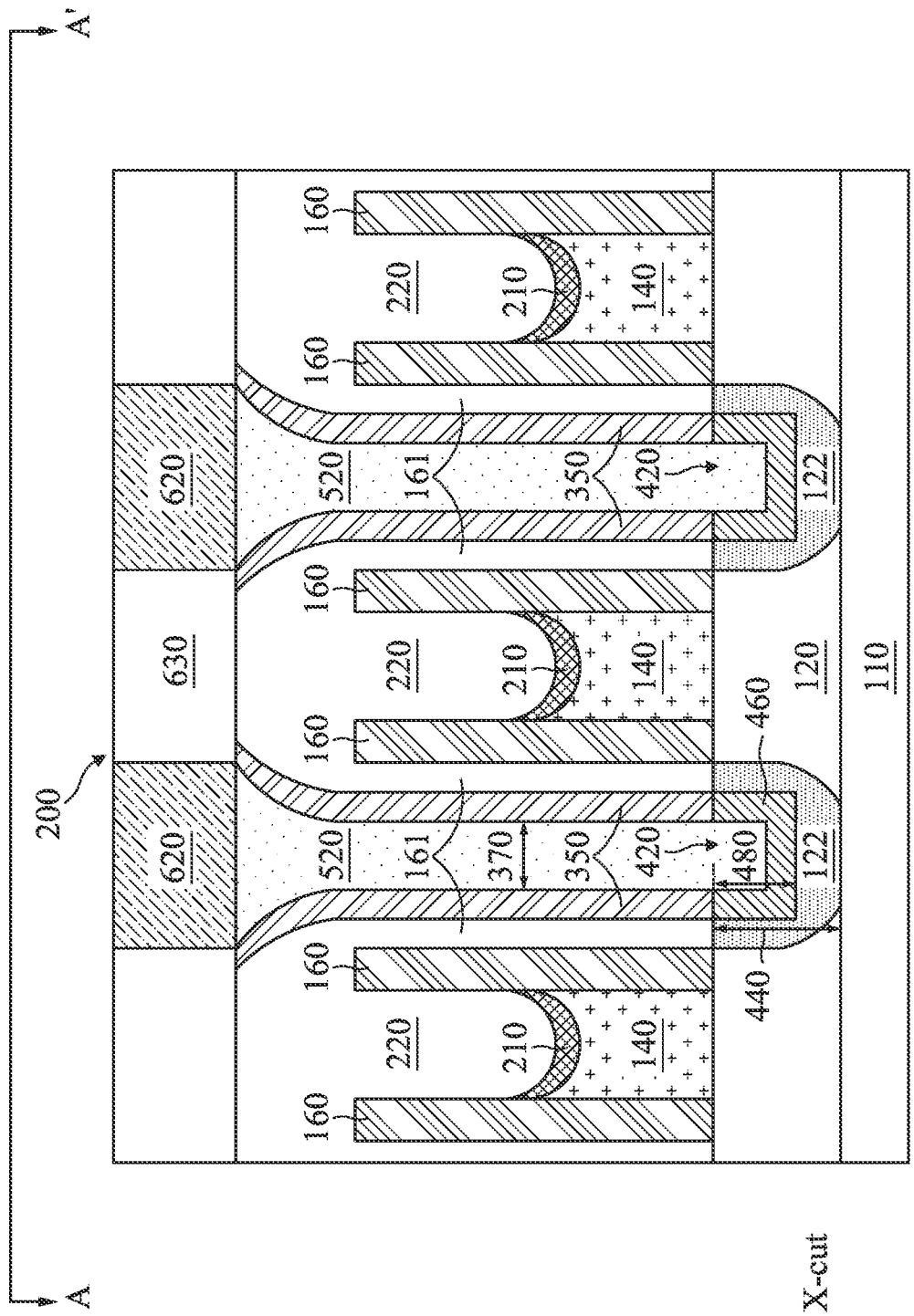
Figure 8B:
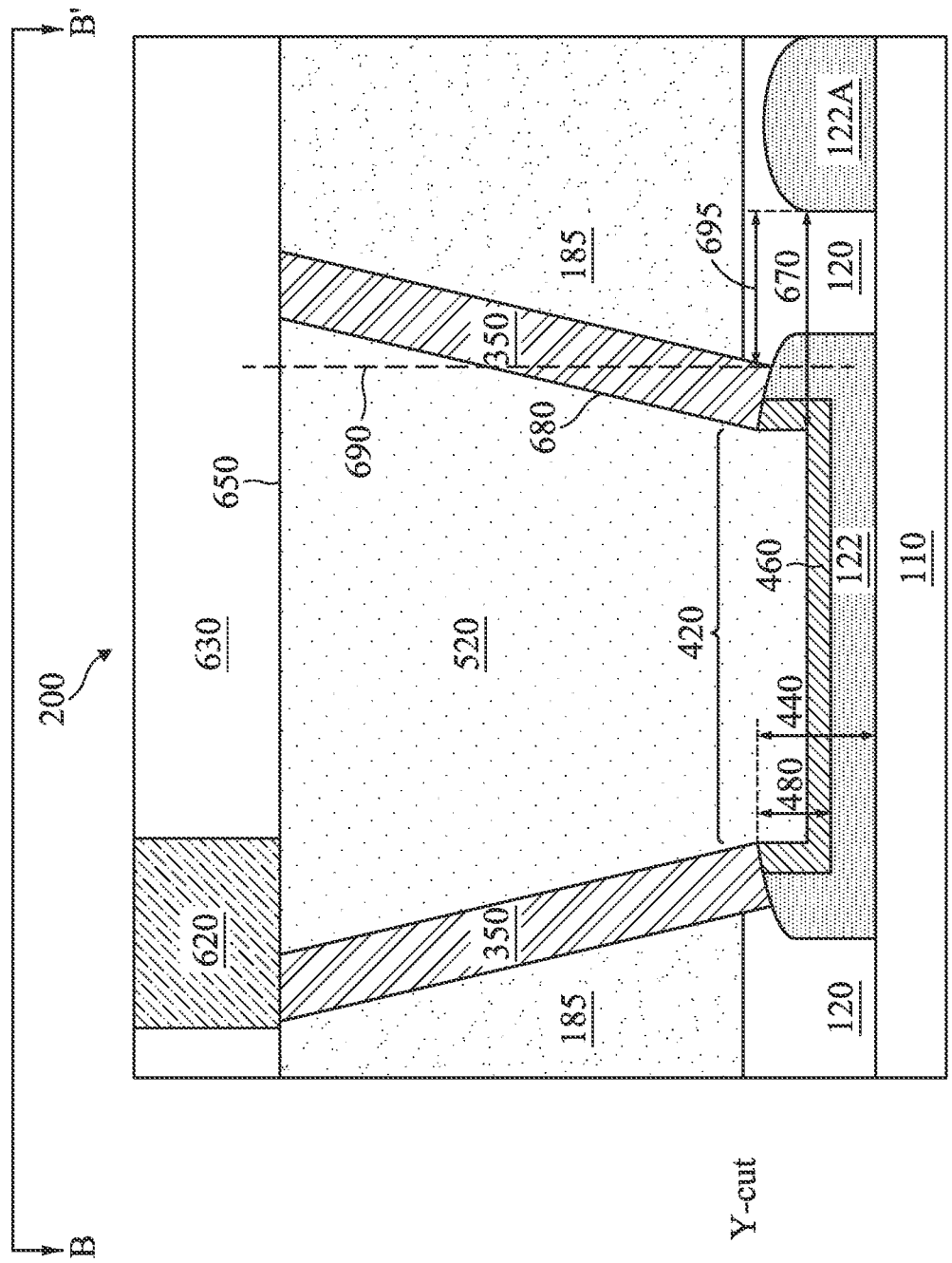

Referring now to FIGS. 8A-8B, source/drain vias 620 are formed over the source/drain contacts 520. In some embodiments, the formation of the source/drain vias 620 may include forming a dielectric layer 630 over the source/drain contacts 520 and over the mask layers 220, etching source/drain via holes in the dielectric layer 630, and subsequently filling the via holes with a conductive material (e.g., tungsten, cobalt, ruthenium, etc.) to form the source/drain vias 620. One of the benefits of the present disclosure is that the unique profile of the source/drain contacts 520 helps enlarge a landing window of the source/drain via 620. In more detail, as semiconductor device sizes get scaled down, the lateral dimensions of the source/drain contacts 520 and the source/drain vias 620 also shrink, and the alignment between the source/drain via 620 and the source/drain contact 520 below becomes more difficult as well. A misalignment between the source/drain via 620 and the source/drain contact 520 may lead to an electrical discontinuity in the IC device 200, which could degrade the performance of the IC device 200 or even render it defective. Here, by configuring the source/drain contact 520 to have a top-wide-bottom-narrow tapered profile, such as shown in FIG. 8B, an upper surface of the source/drain contact 520 is also enlarged compared to source/drain contacts (e.g., that have substantially vertical and non-tapered sidewalls) of conventional IC devices. The enlarged upper surface 650 allows the source/drain contact 520 to "catch" a source/drain via 620 that may be slightly misaligned, for example, a source/drain via 620 that is drifted to the left or right (in the Y-direction) of where it is supposed to be. As such, the source/drain contact 520 herein has a greater tolerance for potential fabrication process imperfections, such as alignment or overlay imperfections.

The unique tapered cross-sectional side view profile of the source/drain contact 520 herein also enhances an electrical between the source/drain contact 520 and other nearby microelectronic components. For example, a source/drain component 122A is illustrated in FIG. 8B as an example one of the microelectronic components disposed nearby the source/drain contact 520. A distance 670 separates a bottom portion of the source/drain contact 520 and the source/drain component 122A. Such a distance 670 is smaller than the distance between a conventional source/drain contact and its nearby source/drain component, because a sidewall 680 of the source/drain contact 520 is tapered inwardly, whereas the sidewall of a conventional source/drain contact would have very little to no inward tapering. Stated differently, had the source/drain contact 520 been implemented with a mostly vertical sidewall (hypothetically represented herein by a dashed vertical line 690 in FIG. 8B), such a distance 695 would have separated the conventional source/drain contact and the nearby source/drain component 122A. As FIG. 8B clearly demonstrates, assuming the location of the source/drain component 122A remains the same, the distance 670 is greater than the distance 695. This means that the source/drain contact 520 has a greater margin for a lateral shift (e.g., due to process imperfections with respect to alignment or overlay) without coming into physical and electrical contact with the source/drain component 122A. Therefore, the chances of electrical shorting between the source/drain contact 520 and nearby components are reduced by the unique profile design of the source/drain contact 520.

It is understood that the IC device discussed above with the low-resistance conductive capping layer may be implemented in a variety of IC applications, including memory devices such as Static Random-Access Memory (SRAM) devices. In that regard, FIG. 9 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 10 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such the processing tools to perform the selective growth process 550 discussed above; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 11 is a flowchart illustrating a method 1000 of fabricating a semiconductor device. The method 1000 includes a step 1010 to provide a semiconductor device that includes: an active region that extends in a first horizontal direction, a source/drain component formed over the active region, and a plurality of gate structures that each extends in a second horizontal direction different from the first horizontal direction. The gate structures are located on opposite sides of the source/drain component and are separated from each other in the first horizontal direction by an interlayer dielectric (ILD).

The method 1000 includes a step 1020 to perform a first etching process that etches a source/drain contact opening through the ILD in a vertical direction. The source/drain contact opening exposes at least a portion of an upper surface of the source/drain component. The source/drain contact opening is etched to be more slanted in the second horizontal direction than in the first horizontal direction.

The method 1000 includes a step 1030 to deposit a spacer layer in the source/drain contact opening. The spacer layer partially fills the source/drain contact opening and reduces a width of the source/drain contact opening in at least the first horizontal direction.

The method 1000 includes a step 1040 to perform a second etching process that etches away a portion of the spacer layer covering the source/drain component and a portion of the source/drain component, thereby forming a recess in the source/drain component.

The method 1000 includes a step 1050 to form a silicide layer over the source/drain component in the recess.

The method 1000 includes a step 1060 to form a source/drain contact over the silicide layer.

In some embodiments, the first etching process is performed such that: the source/drain contact opening has a first slant angle in a plane defined by the vertical direction and the first horizontal direction, the first slant angle being in a range between about 85 degrees and about 90 degrees; and the source/drain contact opening has a second slant angle in a plane defined by the vertical direction and the second horizontal direction, the second slant angle being in a range between about 70 degrees and about 80 degrees.

In some embodiments, the depositing the spacer comprises depositing a dielectric material having a thickness in a range between about 3 nanometers and about 5 nanometers as the spacer layer, the dielectric material being selected from the group consisting of: SiN, SiOCN, SiCN, SiON, SiOC, SiO2.

In some embodiments, the spacer layer is a third spacer layer, and wherein the providing the semiconductor device comprises: forming a first spacer layer on a dummy gate structure; forming a second spacer layer on side surfaces of the first spacer layer; epitaxially growing the source/drain component over the active region; and replacing the dummy gate structure with a metal-containing gate structure after the source/drain component has been epitaxially grown, wherein the third spacer layer is formed on side surfaces of the second spacer layer, and wherein the third spacer layer has a different material composition than at least one of the first spacer layer or the second spacer layer.

In some embodiments, the second etching process is configured such that a depth of the recess is etched to be in a range between about 5 nanometers and about 15 nanometers.

In some embodiments, the silicide layer partially, but not completely fills the recess.

It is understood that additional steps may be performed before, during, or after the steps 1010-1060. For example, the method 1000 may include a gate replacement process. As another example, the method 1000 may include forming additional components of an interconnect structure, including metallization layers and vias. For reasons of simplicity, these additional steps are not discussed in detail herein.

In summary, the present disclosure involves forming a source/drain contact with a tapered or slanted cross-sectional view profile, such that the source/drain contact is wide at the top and narrow at the bottom. In some embodiments, the source/drain contact is more tapered or slanted in the Y-direction than in the X-direction. The present disclosure also involves etching a recess in the source/drain component and forming a silicide layer in the recess, where the silicide layer itself also inherits a recessed profile. The source/drain component is formed over the silicide layer and fills the recess. The present disclosure further involves forming a thickened or widened gate spacer in the source/drain contact opening, so as to reduce a width of the source/drain contact compared to convention source/drain contacts.

The unique fabrication process flow and the resulting IC device structure of the present disclosure offers advantages over conventional devices. It is understood, however, that no particular advantage is required, other embodiments may offer different advantages, and that not all advantages are necessarily disclosed herein. One advantage is the improved performance of IC devices. For example, as device sizes are scaled down in newer technology generations, parasitic capacitance and parasitic resistance become greater concerns, since they affect the time constant and speed of the IC device. The present disclosure reduces parasitic capacitance, since the thickened gate spacer effectively increases the distance between the two conductive plates (e.g., the source/drain contact and a nearby metal gate electrode) of a parasitic capacitor. The present disclosure also reduces parasitic resistance, as the recessed profile of the silicide layer allows both its bottom surface and sidewalls (as opposed to just the bottom surface) to come into contact with the source/drain contact. The greater contact surface area between the silicide layer and the source/drain contact leads to a reduction in electrical parasitic resistance. The reduction in parasitic capacitance and resistance will minimize the time delay and improve the speed of the IC device. Another advantage is a greater landing window for source/drain vias. The top-wide-bottom-narrow profile of the source/drain contact offers a greater landing area for the source/drain via that is formed over the source/drain contact, meaning that the present disclosure has a greater tolerance for alignment or overlay process imperfections between the source/drain contact and via. Yet another advantage is reduced electrical shorting risk. Again, the top-wide-bottom-narrow profile of the source/drain contact results in a greater distance between the source/drain contact and the nearby microelectronic components. Consequently, the present disclosure has a greater margin for any potential lateral shift of the source/drain contact or the nearby source/drain component without creating undesirable electrical shorting. Other advantages may include ease of fabrication and compatibility with existing fabrication processes.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure involves a semiconductor device. The semiconductor device includes an active region that extends in a first horizontal direction. A source/drain component is disposed over the active region. A source/drain contact is disposed over the source/drain component. A gate structure is disposed over the active region. The gate structure extends in a second horizontal direction different from the first horizontal direction. Side surfaces of the source/drain contact are substantially more tapered in the second horizontal direction than in the first horizontal direction.

Another aspect of the present disclosure involves a semiconductor device. The semiconductor device includes a source/drain component disposed over an active region. A silicide layer is disposed over the source/drain component. The source/drain component and the silicide layer are each vertically recessed such that an upper surface and side surfaces of the silicide layer defines a recess. A source/drain contact is disposed over the silicide layer, wherein the source/drain component fills the recess. A source/drain via is disposed over the source/drain contact.

Yet another aspect of the present disclosure involves a method of fabricating a semiconductor device. A semiconductor device is provided that includes: an active region that extends in a first horizontal direction, a source/drain component formed over the active region, and a plurality of gate structures that each extends in a second horizontal direction different from the first horizontal direction. The gate structures are located on opposite sides of the source/drain component and are separated from each other in the first horizontal direction by an interlayer dielectric (ILD). A first etching process is performed that etches a source/drain contact opening through the ILD in a vertical direction. The source/drain contact opening exposes at least a portion of an upper surface of the source/drain component. The source/drain contact opening is etched to be more slanted in the second horizontal direction than in the first horizontal direction. A spacer layer is deposited in the source/drain contact opening. The spacer layer partially fills the source/drain contact opening and reducing a width of the source/drain contact opening in at least the first horizontal direction. A second etching process is performed that etches away a portion of the spacer layer covering the source/drain component and a portion of the source/drain component, thereby forming a recess in the source/drain component. A silicide layer is formed over the source/drain component in the recess. A source/drain contact is formed over the silicide layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A device, comprising:
an active region that extends in a first horizontal direction;
a source/drain component disposed over the active region;
a source/drain contact disposed over the source/drain component; and
a gate structure disposed over the active region, wherein the gate structure extends in a second horizontal direction different from the first horizontal direction;
wherein side surfaces of the source/drain contact are substantially more tapered in the second horizontal direction than in the first horizontal direction.

2. The device of claim 1, wherein:
a first side surface of the source/drain contact in the first horizontal direction has a slant angle in a range between about 85 degrees and about 90 degrees; and
a second side surface of the source/drain contact in the second horizontal direction has a slant angle in a range between about 70 degrees and about 80 degrees.

3. The device of claim 1, further comprising a silicide layer disposed between the source/drain component and the source/drain contact, wherein the silicide layer has a downwardly recessed cross-sectional profile.

4. The device of claim 3, wherein:
the source/drain component has a first depth in a vertical direction;
the silicide layer downwardly protrudes into the source/drain component at a second depth in the vertical direction; and
a ratio of the second depth and the first depth is in a range between about 1:2 and about 1:5.

5. The device of claim 3, further comprising a spacer disposed between the source/drain contact and the gate structure, wherein at least a portion of the silicide layer is disposed directly below a bottom surface of the spacer.

6. The device of claim 3, wherein a portion of a side surface of the source/drain contact is in direct physical contact with the silicide layer.

7. The device of claim 3, wherein a top surface of the active region is more elevated vertically than a bottom surface of the source/drain contact.

8. The device of claim 3, wherein:
the side surface of the source/drain contact is more tapered than a side surface of the silicide layer in the second horizontal direction; and
the silicide layer has a U-shaped profile in a cross-sectional view defined by a vertical direction and the second horizontal direction.

9. The device of claim 1, further comprising a first spacer, a second spacer, and a third spacer disposed between the gate structure and the source/drain contact, the first spacer, the second spacer, and the third spacer having a first width, a second width, and a third width, respectively;
wherein:
the first spacer is disposed immediately adjacent to the gate structure;
the third spacer is disposed immediately adjacent to the source/drain contact;
the second spacer is disposed between the first spacer and the third spacer; and
the third spacer is thicker than at least one of the first spacer or the second spacer.

10. The device of claim 9, wherein the third spacer has a greater dimension in the second horizontal direction than in the first horizontal direction.

11. A device, comprising:
a source/drain component disposed over an active region;
a silicide layer disposed over the source/drain component, wherein the source/drain component and the silicide layer are each vertically recessed such that an upper surface and side surfaces of the silicide layer defines a recess;
a source/drain contact disposed over the silicide layer, wherein the source/drain component fills the recess;
a source/drain via disposed over the source/drain contact;
a gate structure disposed over the active region; and
a first spacer, a second spacer, and a third spacer disposed between the gate structure and the source/drain contact;
wherein:
the source/drain contact is disposed closer to the third spacer than to the second spacer or the first spacer; and
a ratio of a width of the third spacer and a width of the source/drain contact is in a range between about 0.2:1 and about 0.3:1.

12. The device of claim 11, wherein:
the active region extends in a first horizontal direction;
the gate structure extends in a second horizontal direction different from the first horizontal direction; and
the source/drain contact has more slanted sidewalls in the second horizontal direction than in the first horizontal direction.

13. The device of claim 12, wherein the sidewall of the source/drain contact has a slant angle in a range between about 70 degrees and about 80 degrees in a plane defined by the second horizontal direction and a vertically direction.

14. A device, comprising:
an active region that extends in a first horizontal direction in a top view;
a source/drain disposed over the active region in a vertical direction in a cross-sectional side view;
a source/drain contact disposed over the source/drain in the vertical direction in the cross-sectional side view;

a silicide layer disposed between the source/drain and the source/drain contact in the cross-sectional side view, wherein the silicide layer has a downward recess in the cross-sectional side view;
a gate disposed over the active region in the cross-sectional side view, wherein the gate extends in a second horizontal direction in the top view; and
one or more spacers disposed between the source/drain contact and the gate in the cross-sectional side view;
wherein:
the second horizontal direction is different from the first horizontal direction; and
side surfaces of the source/drain contact are substantially more tapered in the second horizontal direction than in the first horizontal direction.

15. The device of claim 14, wherein:
a first side surface of the source/drain contact in the first horizontal direction has a slant angle in a range between about 85 degrees and about 90 degrees; and
a second side surface of the source/drain contact in the second horizontal direction has a slant angle in a range between about 70 degrees and about 80 degrees.

16. The device of claim 14, wherein:
the source/drain has a first dimension in the vertical direction in the cross-sectional side view; and
the silicide layer downwardly protrudes into the source/drain at a depth less than the first dimension in the vertical direction in the cross-sectional side view.

17. The device of claim 14, wherein at least a portion of the silicide layer is disposed directly below a bottom surface of the one or more spacers in the cross-sectional side view.

18. The device of claim 14, wherein a portion of a side surface of the source/drain contact extends to the silicide layer in the cross-sectional side view.

19. The device of claim 14, wherein a top surface of the active region is more elevated vertically than a bottom surface of the source/drain contact in the cross-sectional side view.

20. The device of claim 14, wherein:
the one or more spacers include a first spacer, a second spacer, and a third spacer having a first width, a second width, and a third width, respectively;
the first spacer is disposed immediately adjacent to the gate in the cross-sectional side view;
the third spacer is disposed immediately adjacent to the source/drain contact in the cross-sectional side view;
the second spacer is disposed between the first spacer and the third spacer in the cross-sectional side view; and
the third width is greater than the first width or the second width in the cross-sectional side view.

* * * * *